(12) United States Patent
Yamada

(10) Patent No.: US 9,214,919 B2
(45) Date of Patent: Dec. 15, 2015

(54) RESONATOR ELEMENT, RESONATOR, OSCILLATOR, ELECTRONIC APPARATUS, AND MOVING OBJECT

(71) Applicant: SEIKO EPSON CORPORATION, Tokyo (JP)

(72) Inventor: Akinori Yamada, Ina (JP)

(73) Assignee: SEIKO EPSON CORPORATION, Tokyo (JP)

( * ) Notice: Subject to any disclaimer, the term of this patent is extended or adjusted under 35 U.S.C. 154(b) by 0 days.

(21) Appl. No.: 14/224,999

(22) Filed: Mar. 25, 2014

(65) Prior Publication Data

US 2014/0292435 A1 Oct. 2, 2014

(30) Foreign Application Priority Data

Mar. 29, 2013 (JP) .................................. 2013-075328

(51) Int. Cl.
 *H03B 5/32* (2006.01)
 *H03H 9/215* (2006.01)
 *H03H 9/10* (2006.01)

(52) U.S. Cl.
 CPC ............. *H03H 9/215* (2013.01); *H03H 9/1021* (2013.01); *H03B 5/32* (2013.01)

(58) Field of Classification Search
 CPC ............. G04F 5/04; G04F 5/06; G04F 5/063; H03B 5/30; H03B 5/32; H03H 9/21; H03H 9/215; H03H 9/2468; H03H 9/2473; H03H 9/2478; H03H 9/2484; H03H 9/2489; H03H 9/2494; H03H 2003/026; H03H 2003/0492
 USPC .......... 310/311, 312, 348, 370; 331/154, 156, 331/158
 See application file for complete search history.

(56) References Cited

U.S. PATENT DOCUMENTS

| 3,517,288 | A | * | 6/1970 | Bennett et al. ................. 318/129 |
| 7,084,556 | B1 | * | 8/2006 | Dalla Piazza et al. ......... 310/370 |
| 2006/0279176 | A1 | * | 12/2006 | Dalla Piazza et al. ......... 310/348 |
| 2009/0158566 | A1 | * | 6/2009 | Hagelin et al. ................ 29/25.35 |
| 2011/0001394 | A1 | * | 1/2011 | Dalla Piazza et al. ......... 310/325 |
| 2011/0018399 | A1 | * | 1/2011 | Murata et al. .................. 310/346 |
| 2012/0098389 | A1 | * | 4/2012 | Dalla Piazza et al. ......... 310/348 |
| 2014/0192628 | A1 | * | 7/2014 | Tamura .......................... 368/159 |
| 2014/0241132 | A1 | * | 8/2014 | Tamura ............................ 368/47 |

FOREIGN PATENT DOCUMENTS

| EP | 1 732 217 B1 | 1/2009 |
| JP | A-49-98219 | 9/1974 |
| JP | A-2002-141770 | 5/2002 |
| JP | A-2006-345519 | 12/2006 |
| JP | A-2010-232932 | 10/2010 |
| JP | A-2011-82841 | 4/2011 |

* cited by examiner

Primary Examiner — Levi Gannon
(74) Attorney, Agent, or Firm — Oliff PLC

(57) ABSTRACT

A resonator includes a resonator element including a base section, vibrating arms extending from the base section, and a support arm disposed between the vibrating arms, a package adapted to support the resonator element, and electrically-conductive adhesives adapted to fix the support arm to the package, the support arm includes a tip portion and a width-decreasing portion having a width smaller than the width of the tip portion, and the electrically-conductive adhesive has contact with at least a part of the width-decreasing portion in a planar view.

15 Claims, 22 Drawing Sheets

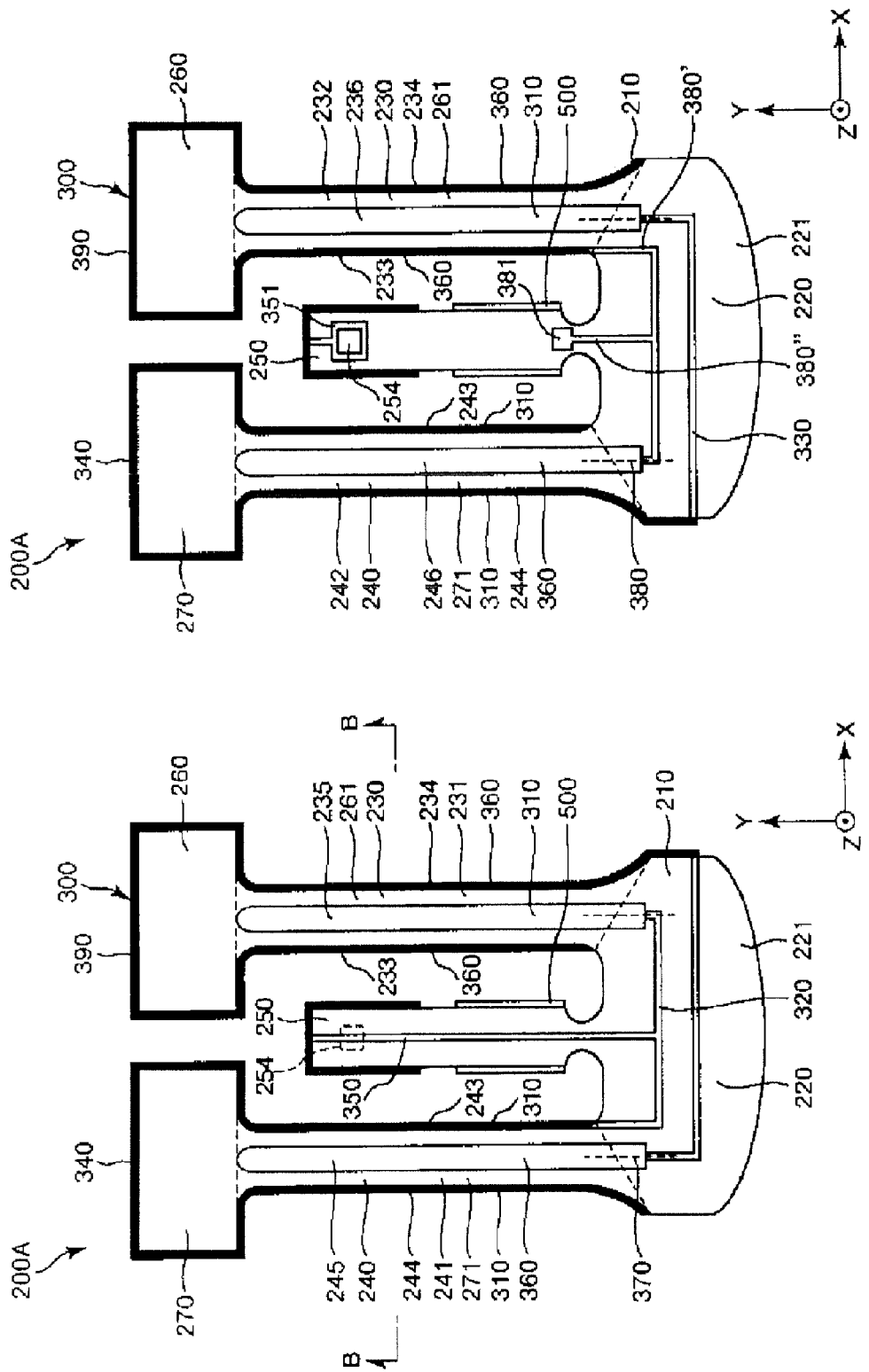

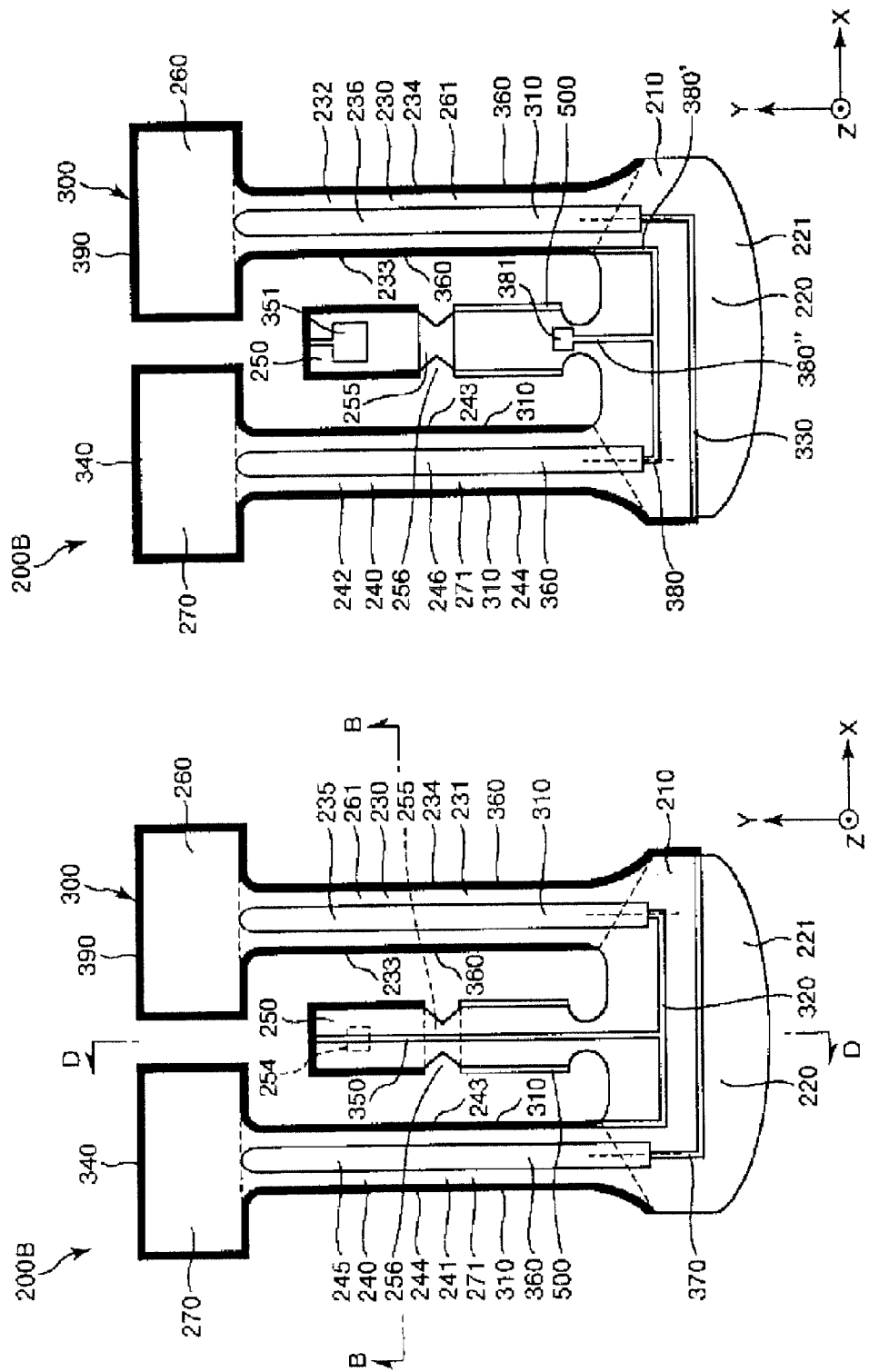

RESONATOR ELEMENT, RESONATOR, OSCILLATOR, ELECTRONIC APPARATUS, AND MOVING OBJECT

BACKGROUND

1. Technical Field

The present invention relates to a resonator element, a resonator, an oscillator, an electronic apparatus, and a moving object.

2. Related Art

In the past, there has been known a quartz crystal oscillator having a resonator element housed in a package (see, e.g., JP-A-2002-141770 (Document 1)).

The resonator of Document 1 has a base section, a pair of vibrating arms each having a widened portion disposed in one end portion, a resonator element disposed between the pair of vibrating arms, and having a support arm extending from the base section, and a package housing the resonator element. Further, the resonator element is fixed to the package via a pair of electrically-conductive adhesives. The pair of electrically-conductive adhesives are disposed on one surface of the support arm in the thickness direction. According to such a configuration as described above, the resonator can be made relatively small.

However, according to the resonator of Document 1, the resonant frequency in the X-common mode in which the pair of vibrating arms flexurally vibrating in roughly the same in-plane directions in a plan view approximates to the resonant frequency in the main mode in which the pair of vibrating arms repeat getting closer to and getting away from each other to flexurally vibrate roughly in plane, and thus, the X-common mode is combined with the main mode, and a vibration mode mixed with the vibration mode of the X-common mode appears when driving the resonator in the main mode. Although in the tuning-fork resonator element, there is adopted a structure in which the vibration leakage in the main mode becomes as small as possible in the support section, the vibration leakage with respect to the vibration mode of the X-common mode is not suppressed. Therefore, in the resonator of Document 1, the vibration leakage increases when vibrating in the main mode, and thus, the deterioration of the Q value and the deterioration of the CI value due to the deterioration of the Q value are caused problematically.

The resonator element described in JP-A-49-98219 (Document 2) is provided with a constricted part with a decreased width formed in the support arm near to the base section in addition to the features of the resonator element described in Document 1, and can therefore decrease the degree of the approximation of the resonant frequency in the X-common mode to the resonant frequency in the main mode. It should be noted that in such a resonator element as described above, the resonator element is attached to the package in the portions located on the tip side (on the opposite side to the base section) of the constricted part via the pair of electrically-conductive adhesives.

However, in the miniaturization, it is insufficient to reduce the degree of the approximation of the resonant frequency in the X-common mode to the resonant frequency in the main mode.

SUMMARY

An advantage of the invention is to provide a resonator element, a resonator, an oscillator, an electronic apparatus, and a moving object each capable of sufficiently separating the resonant frequency in the X-common mode from the resonant frequency in the main mode in the miniaturization.

The invention can be implemented as the following application examples.

Application Example 1

A resonator element according to this application example of the invention includes a base section, and a resonator element including a pair of vibrating arms extending in a first direction from the base section, arranged in a second direction perpendicular to the first direction, and flexurally vibrating while alternately repeating getting closer to and getting away from each other along the second direction in a planar view, and a support arm disposed between the pair of vibrating arms, and extending along the first direction from the base section in the planar view, and the support arm includes a first portion, and a second portion disposed on the base section side of the first portion in the planar view, smaller in length along the second direction than the first portion, and attached to a base with a fixation material.

According to this configuration, even if the resonator element is miniaturized, the resonant frequency in an unwanted mode can sufficiently be separated from the resonant frequency in the main mode.

Application Example 2

In the resonator element according to the application example described above, it is preferable that a Young's modulus of the fixation material is smaller than a Young's modulus of the resonator element.

According to this configuration, the vibration leakage of the resonator element can more effectively be reduced.

Application Example 3

In the resonator element according to the application example described above, it is preferable that the Young's modulus of the fixation material is in a range of no lower than 50 MPa and no higher than 6000 MPa.

According to this configuration, the vibration leakage of the resonator element can more effectively be reduced.

Application Example 4

In the resonator element according to the application example described above, it is preferable that a length of the second portion along the second direction is no lower than 20% and no higher than 50% of a length of the first portion along the second direction.

According to this configuration, it is possible to more surely keep the resonant frequency in the X-common mode away from the resonant frequency in the main mode toward the lower frequency side.

Application Example 5

In the resonator element according to the application example described above, it is preferable that a side surface of the second portion along a third direction perpendicular to the first direction and the second direction includes an area to be bonded to the fixation material.

According to this configuration, by increasing the vibration leakage in the second-order harmonic mode (the second-order harmonic mode in the case of assuming that the X-reversed phase flexural vibration mode as the main mode is the first order), the CI-value in the second-order harmonic mode can be increased, and as a result, the possibility that the oscillator equipped with the resonator element erroneously oscillates at a frequency of the second-order harmonic mode can be reduced.

Application Example 6

In the resonator element according to the application example described above, it is preferable that the second portion includes a projecting section formed of a side surface along a third direction perpendicular to the first direction and the second direction projecting in the second direction.

According to this configuration, the projecting section reduces the possibility that the fixation material flows around to the upper surface of the support arm.

Application Example 7

In the resonator element according to the application example described above, it is preferable that the first portion is provided with a recessed section disposed in an area to be attached to the base with the fixation material.

According to this configuration, the fixation material can enter the inside of the recessed section, and it is possible to reduce the possibility of the short-circuit between the fixation section of the first portion and the fixation section of the second portion.

Application Example 8

In the resonator element according to the application example described above, it is preferable that the recessed section penetrates from a first surface of the support arm to be attached to the base to a second surface of the support arm on an opposite side to the first surface.

According to this configuration, it is possible to form the first wiring line or the second wiring line inside the recessed section, and therefore, it can be eliminated to dispose the first wiring line or the second wiring line on the end surface of the support arm.

Application Example 9

In the resonator element according to the application example described above, it is preferable that the support arm is provided with a groove disposed along the second direction on the first portion side of the second portion in the planar view.

According to this configuration, the possibility of the short-circuit between the fixation section of the first portion and the fixation section of the second portion can surely be reduced.

Application Example 10

In the resonator element according to the application example described above, it is preferable that the vibrating arms each include a weight section, and an arm section disposed between the weight section and the base section in the planar view.

According to this configuration, miniaturization of the resonator can be achieved.

Application Example 11

In the resonator element according to the application example described above, it is preferable that the weight section includes a widened portion larger in width along the second direction than the arm section.

According to this configuration, miniaturization of the resonator can be achieved.

Application Example 12

A resonator according to this application example of the invention includes the resonator element according to the application example described above, and the base on which the resonator element is mounted.

According to this application example, the resonator with high reliability can be obtained.

Application Example 13

An oscillator according to this application example of the invention includes the resonator according to the application example described above, and an oscillator circuit.

According to this application example, the oscillator with high reliability can be obtained.

Application Example 14

An electronic apparatus according to this application example of the invention includes the resonator element according to the application example described above.

According to this application example, the electronic apparatus with high reliability can be obtained.

Application Example 15

A moving object according to this application example of the invention includes the resonator element according to the application example described above.

According to this application example, the moving object with high reliability can be obtained.

BRIEF DESCRIPTION OF THE DRAWINGS

The invention will be described with reference to the accompanying drawings, wherein like numbers reference like elements.

FIGS. 9A and 9B are plan views showing the resonator element shown in FIG. 1, wherein FIG. 9A is a top view, and FIG. 9B is a bottom view (a transparent view).

FIGS. 11A and 11B are plan views showing a resonator element according to a second embodiment of the invention, wherein FIG. 11A is a top view, and FIG. 11B is a bottom view (a transparent view).

FIGS. 12A and 12B are plan views showing a resonator element according to a third embodiment of the invention, wherein FIG. 12A is a top view, and FIG. 12B is a bottom view (a transparent view).

FIGS. 14A and 14B are plan views showing a resonator element according to a fourth embodiment of the invention, wherein FIG. 14A is a top view, and FIG. 14B is a bottom view (a transparent view).

FIGS. 16A and 16B are plan views showing a resonator element according to a fifth embodiment of the invention, wherein FIG. 16A is a top view, and FIG. 16B is a bottom view (a transparent view).

FIGS. 17A and 17B are plan views showing a resonator element according to a sixth embodiment of the invention, wherein FIG. 17A is a top view, and FIG. 17B is a bottom view (a transparent view).

DESCRIPTION OF EXEMPLARY EMBODIMENTS

A resonator, an oscillator, an electronic apparatus, and a moving object according to some preferred embodiments of the invention will hereinafter be explained with reference to the accompanying drawings.

1. Resonator

Firstly, a resonator according to an embodiment of the invention will be explained.

First Embodiment

Figure 1:
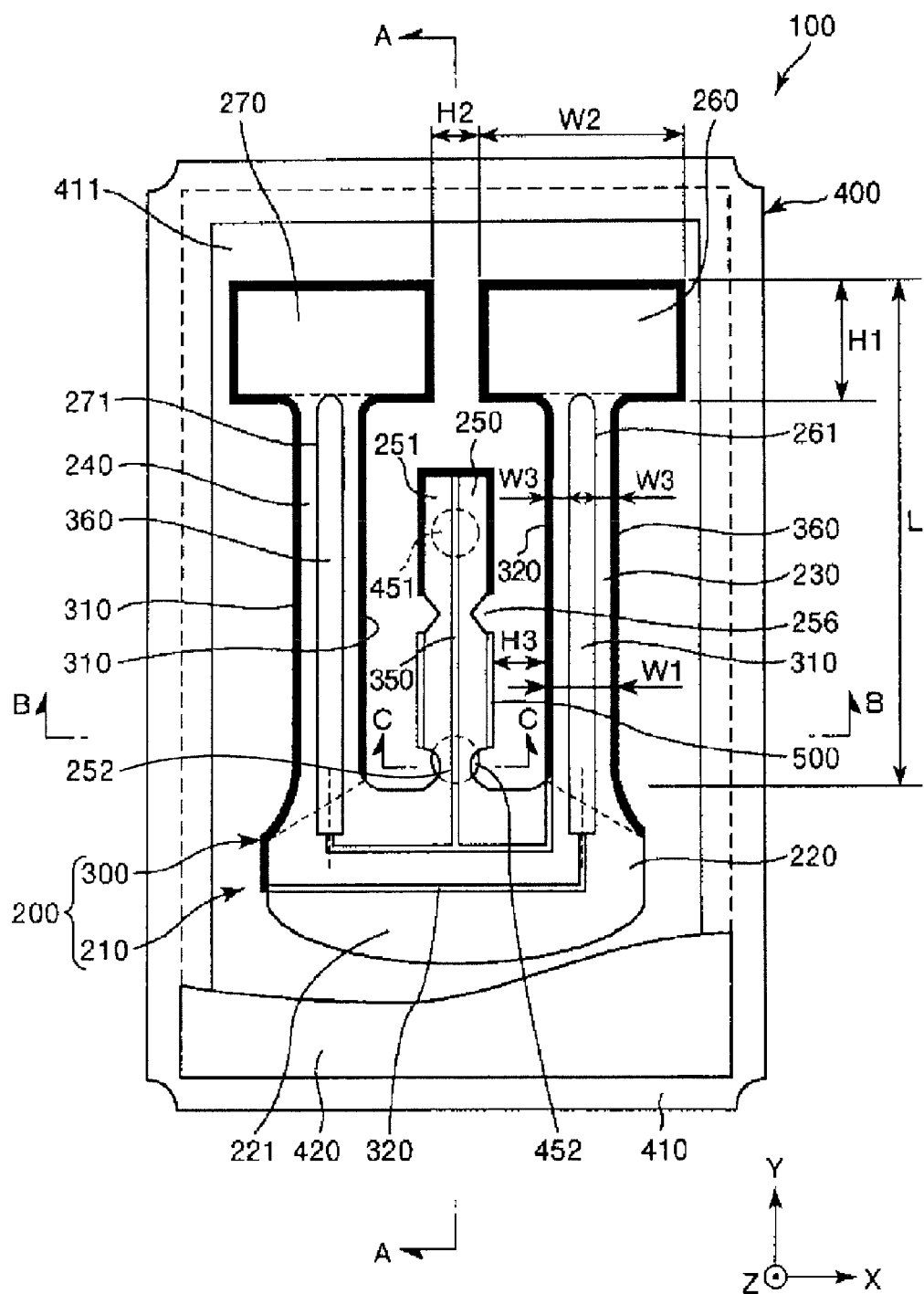
FIG. 1 is a plan view showing a resonator according to a first embodiment of the invention.
Figure 2:
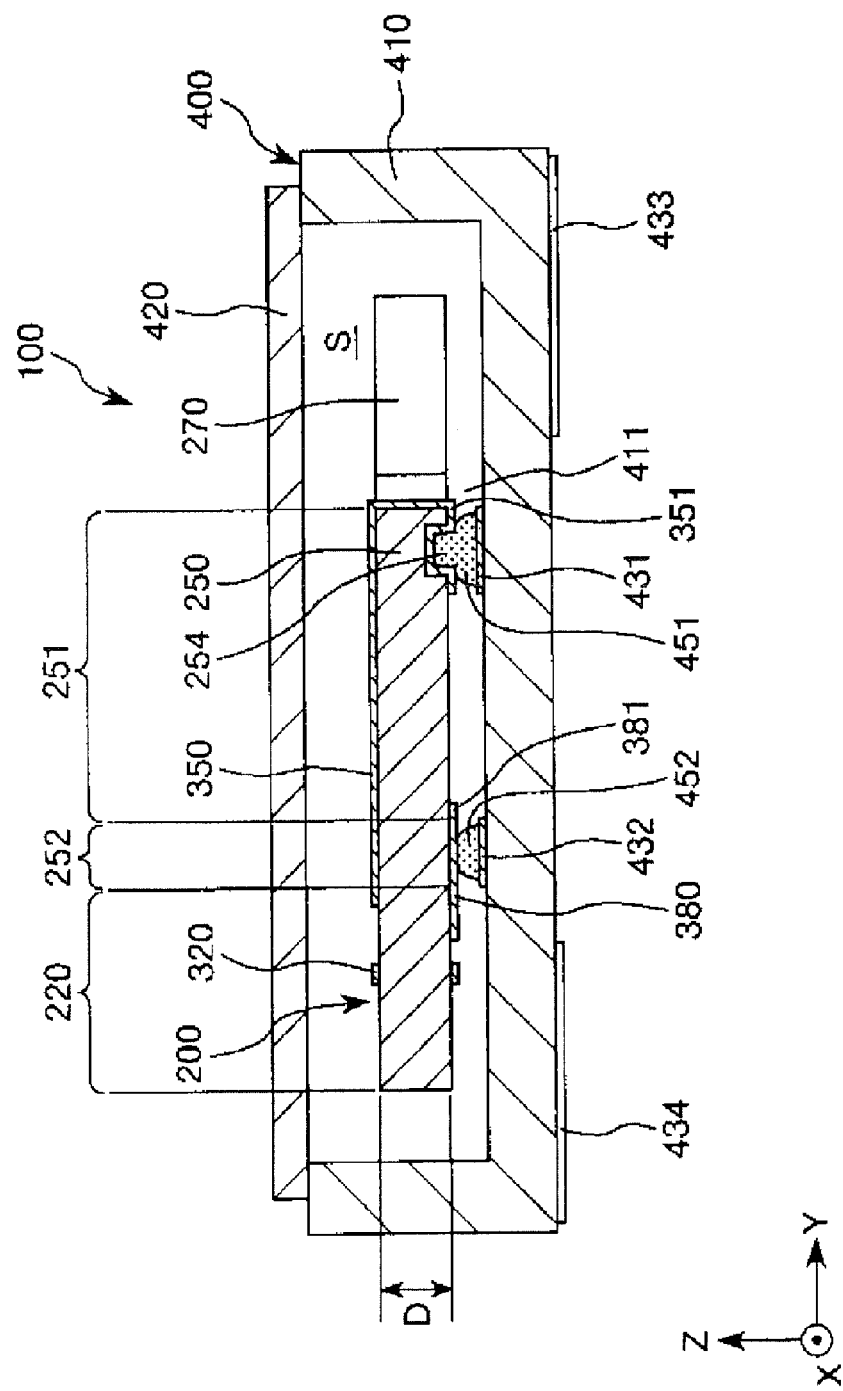
FIG. 2 is a cross-sectional view along the A-A line in FIG. 1.
Figures 3A, 3B:
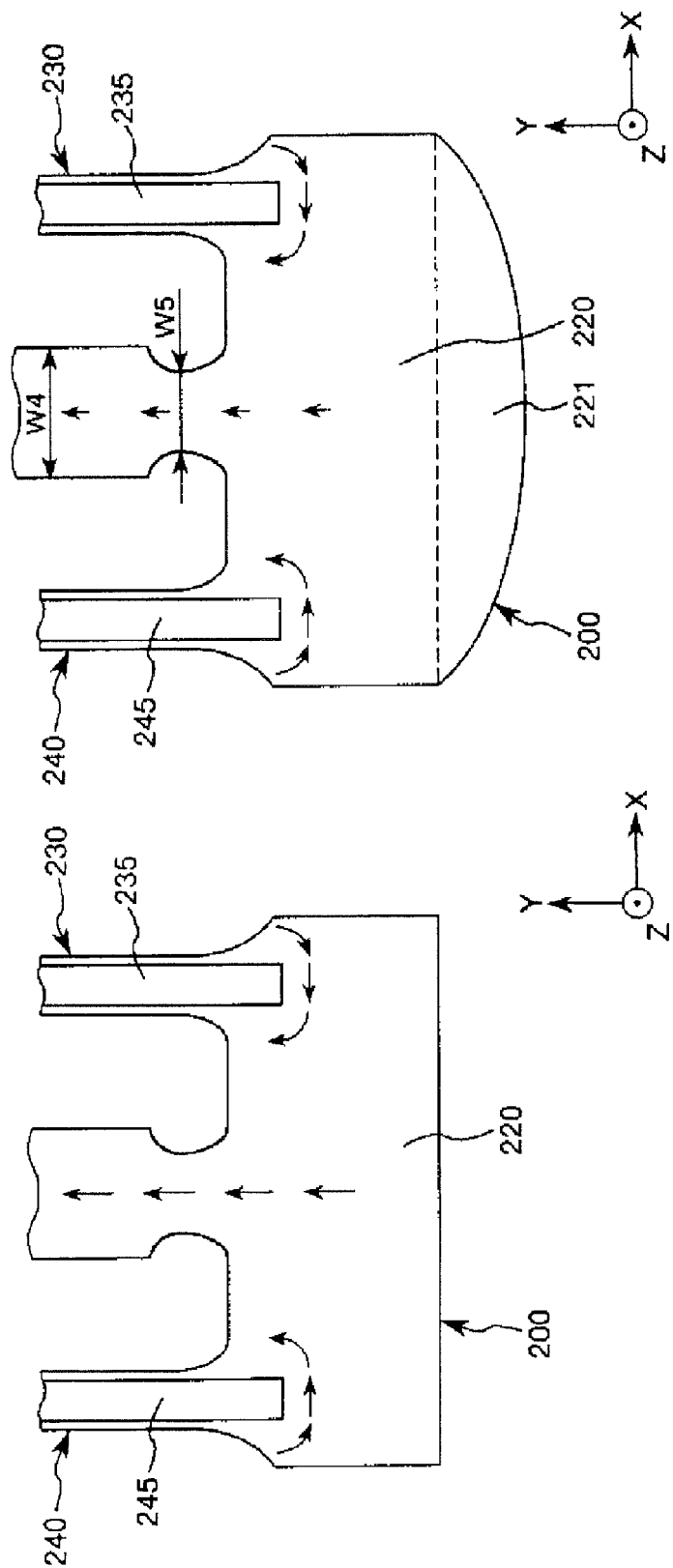
FIGS. 3A and 3B are plan views for explaining the principle of reduction in vibration leakage.
Figure 4:
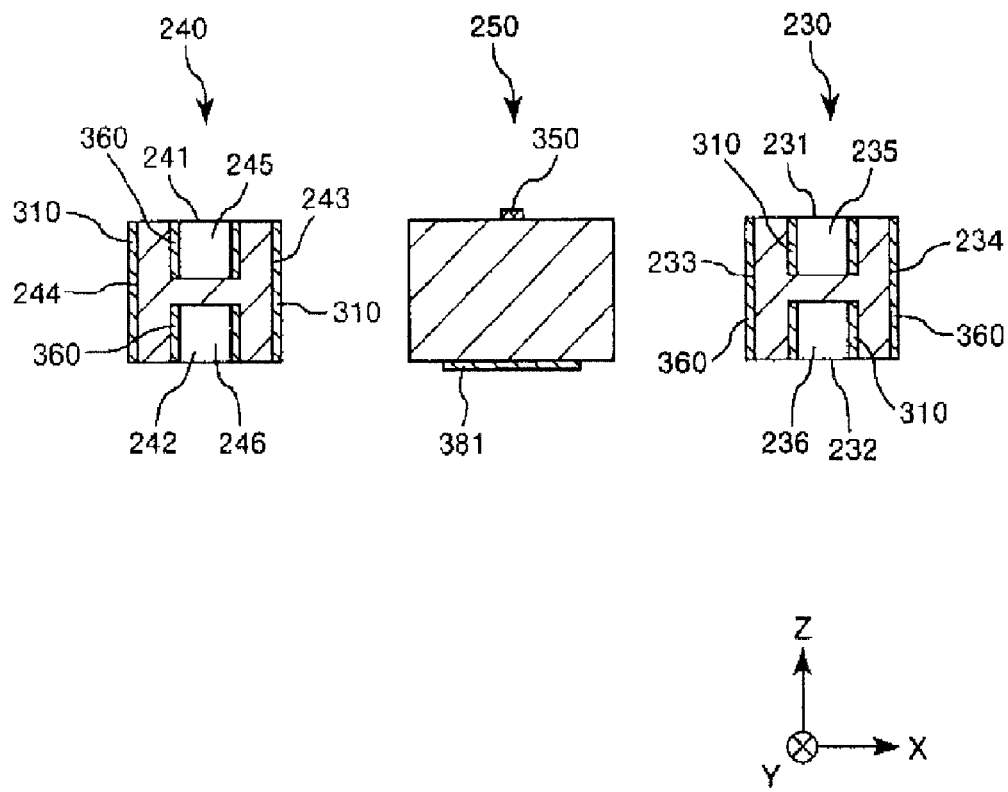
FIG. 4 is a cross-sectional view along the B-B line in FIG. 1.
Figure 5:
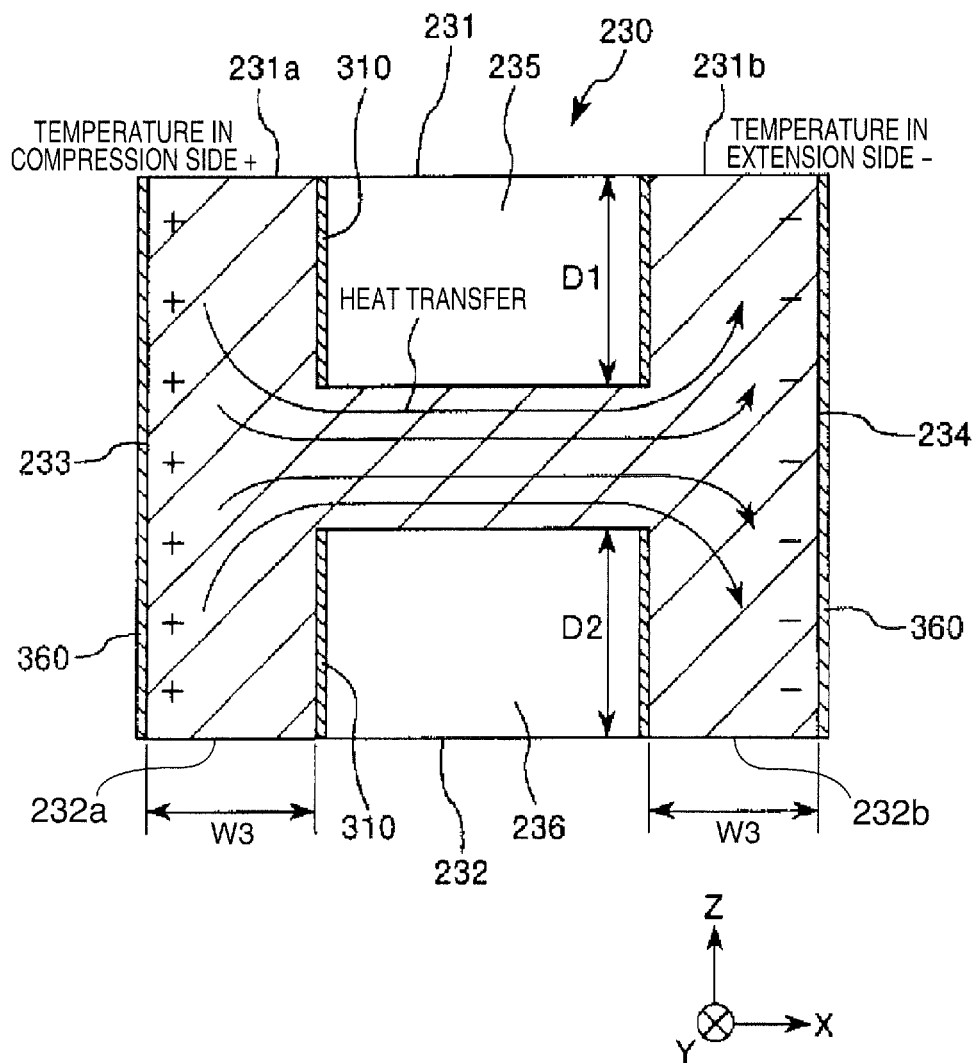
FIG. 5 is a cross-sectional view of a vibrating arm for explaining heat transfer in a flexural vibration.
Figure 6:
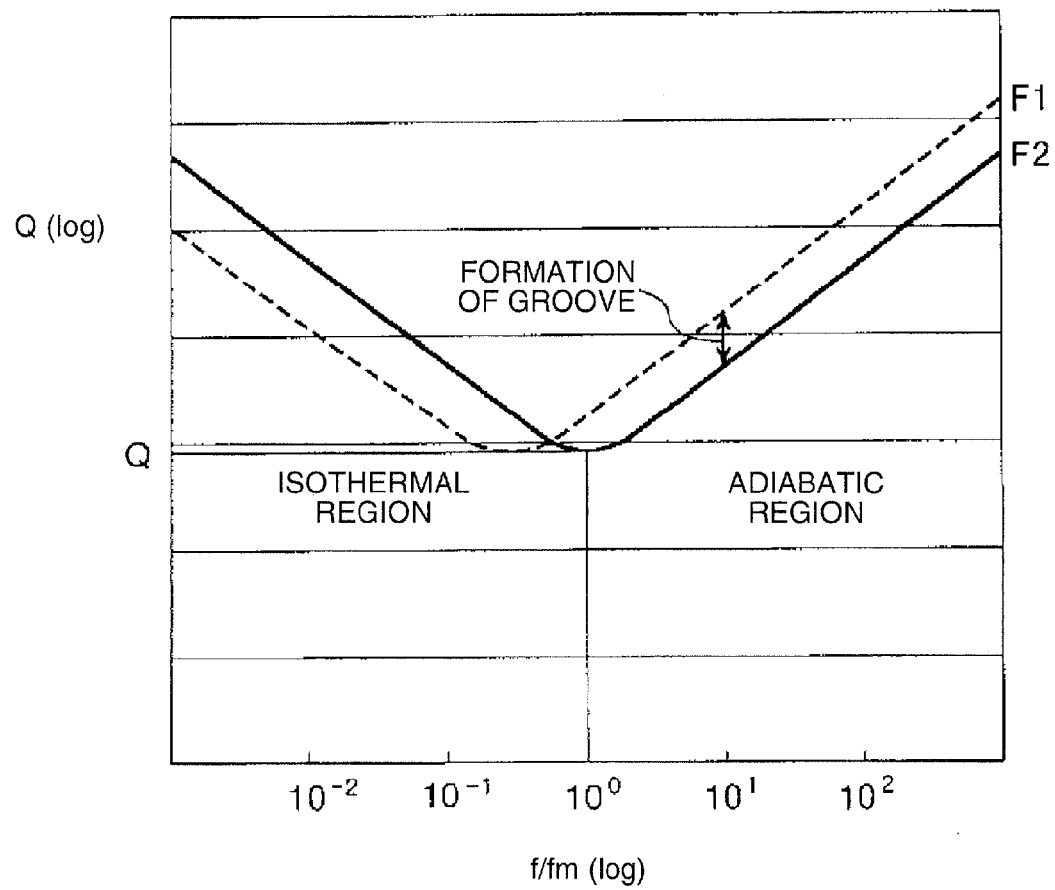
FIG. 6 is a graph showing a relationship between Q-value and f/fm.
Figure 7:
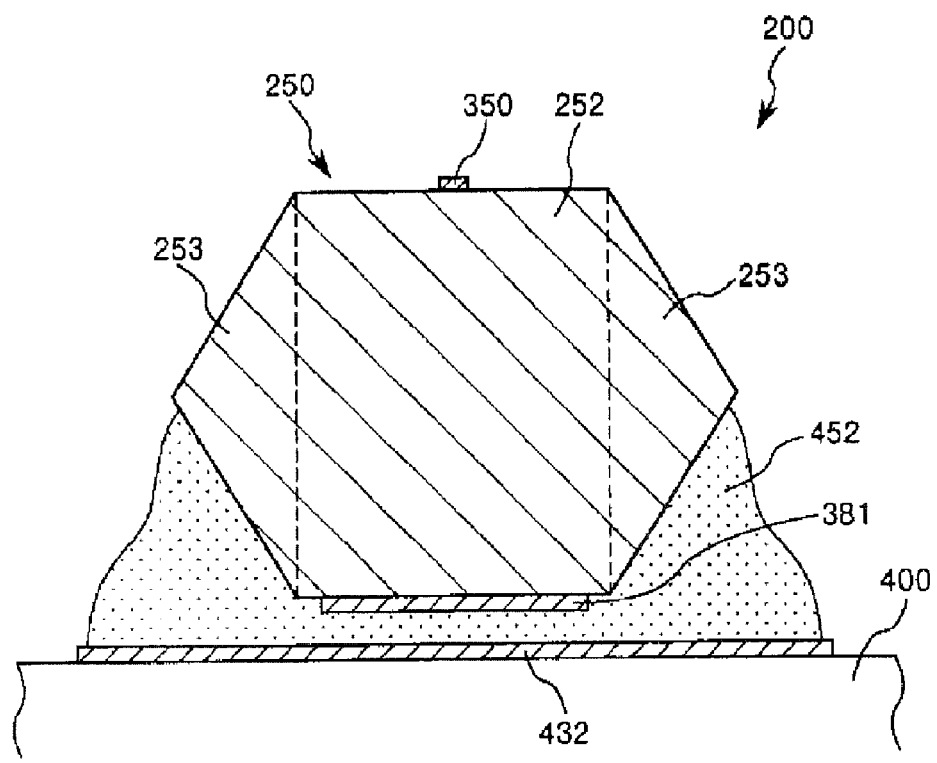
FIG. 7 is a cross-sectional view along the C-C line in FIG. 1.
Figure 8:
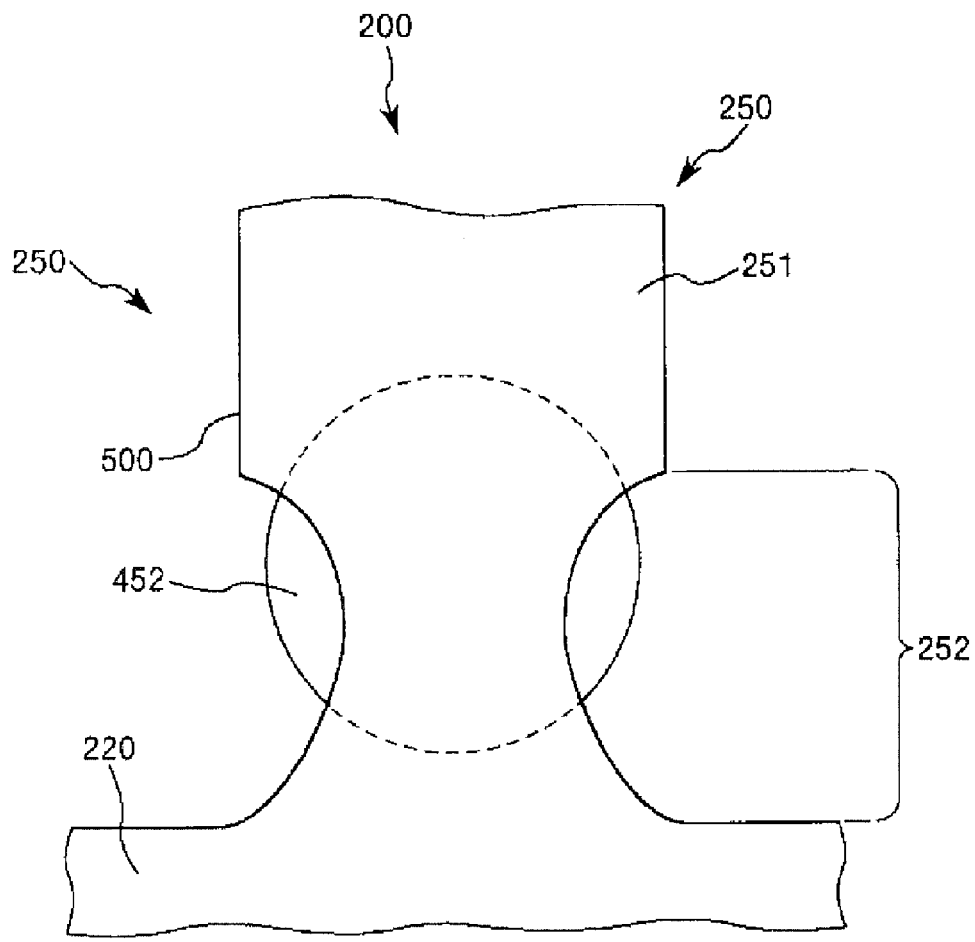
FIG. 8 is a plan view showing a positional relationship between a width-decreasing portion and an electrically-conductive adhesive.
Figure 9A:
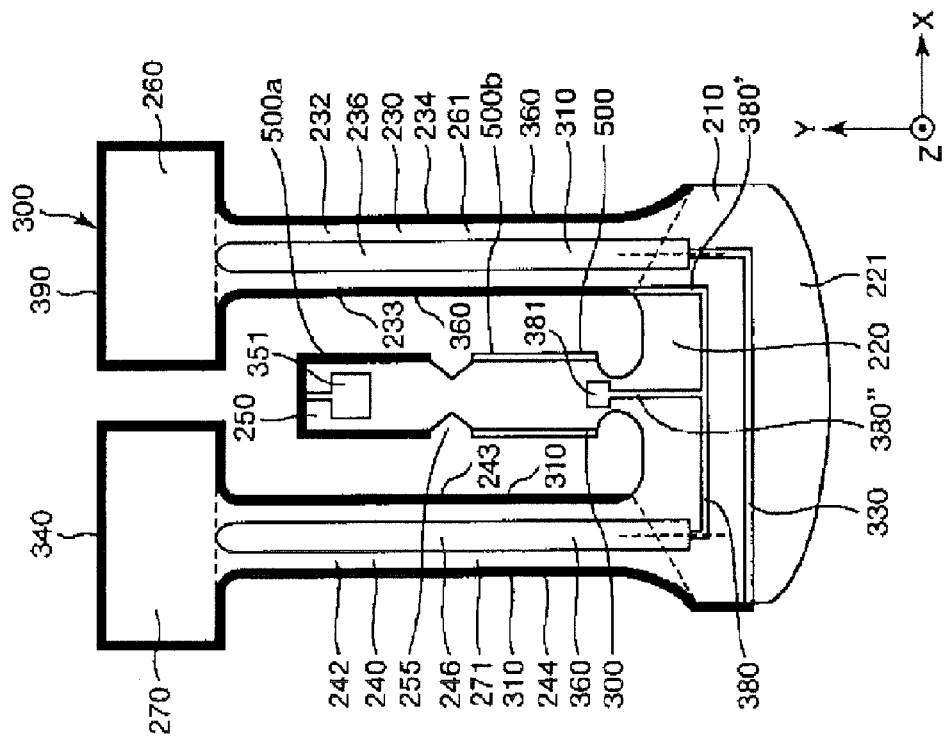
Figure 9B:
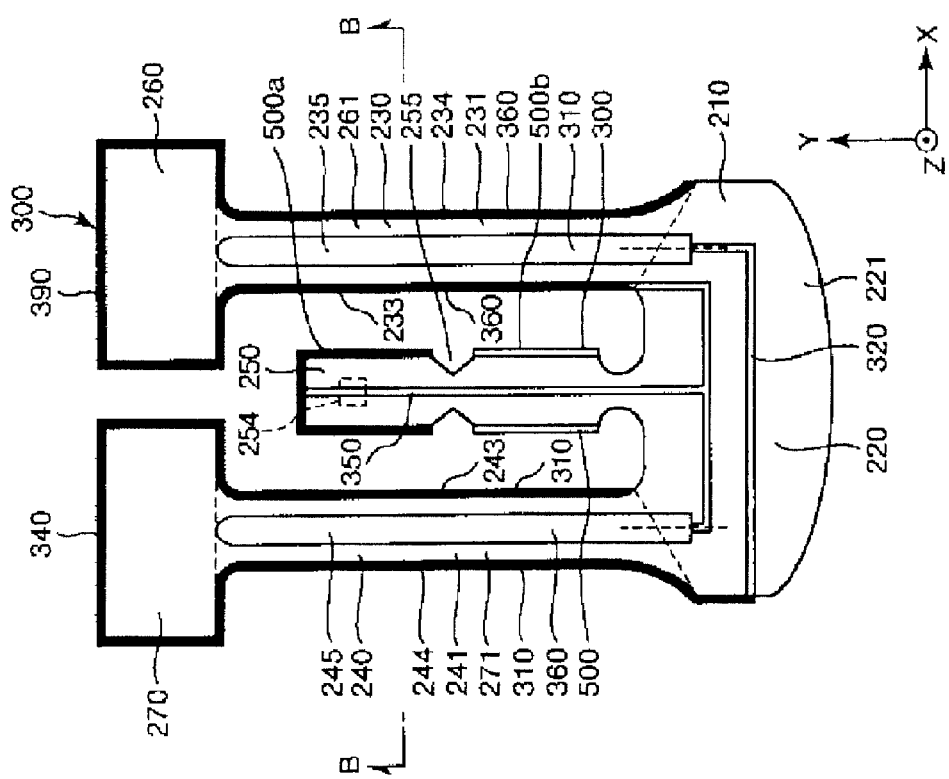
Figure 10A:
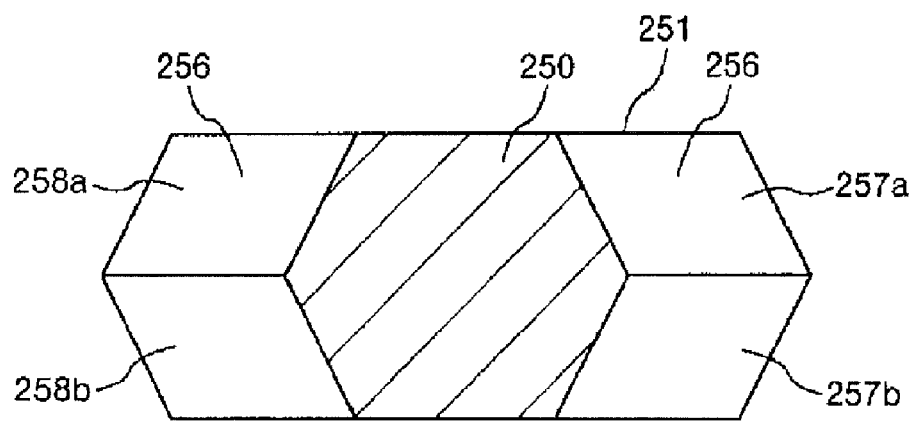
FIGS. 10A through 10C are cross-sectional views for explaining a method of manufacturing the resonator element shown in FIG. 1.
Figure 10B:
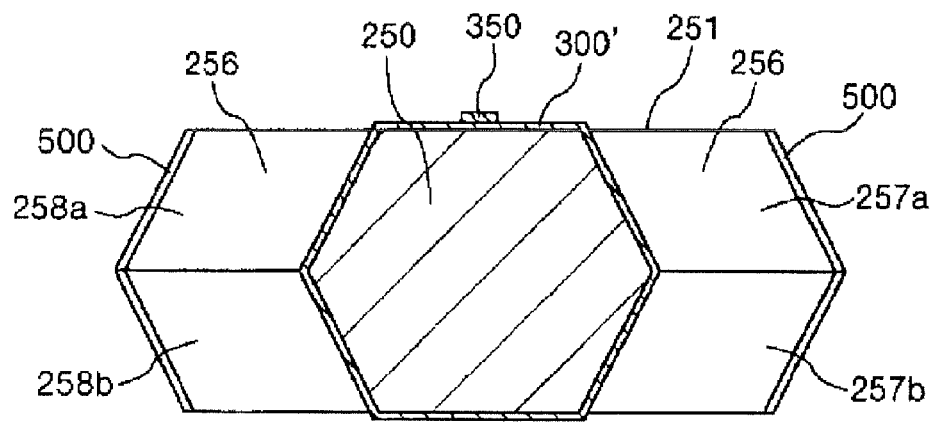
Figure 10C:
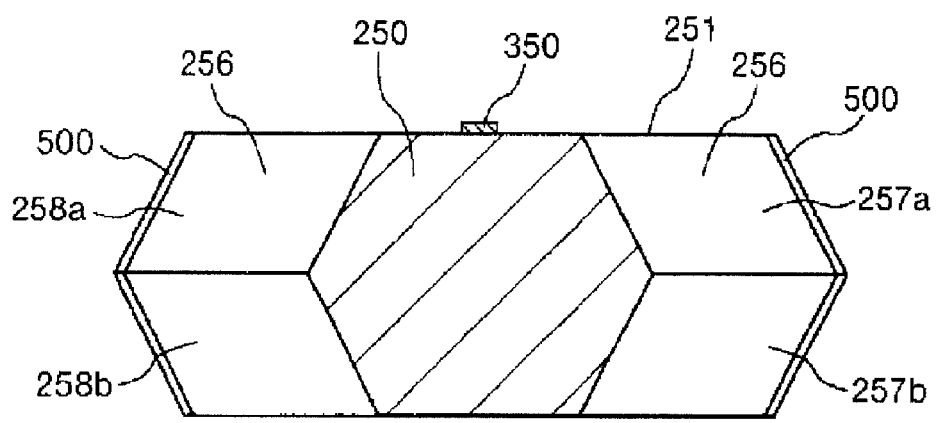

FIG. 1 is a plan view showing a resonator according to a first embodiment of the invention, FIG. 2 is a cross-sectional view along the A-A line in FIG. 1, FIGS. 3A and 3B are plan views for explaining the principle of reduction in vibration leakage, FIG. 4 is a cross-sectional view along the B-B line in FIG. 1, FIG. 5 is a cross-sectional view of a vibrating arm for explaining heat transfer in a flexural vibration, FIG. 6 is a graph showing a relationship between Q-value and f/fm, FIG. 7 is a cross-sectional view along the C-C line in FIG. 1, FIG. 8 is a plan view showing a positional relationship between a width-decreasing portion and an electrically-conductive adhesive, FIGS. 9A and 9B are plan views showing the resonator element shown in FIG. 1, wherein FIG. 9A is a top view, and FIG. 9B is a bottom view (a transparent view), and FIGS. 10A through 10C are cross-sectional views for explaining a method of manufacturing the resonator element shown in FIG. 1. It should be noted that in each of the drawings, the X axis, the Y axis, and the Z axis are shown as the three axes perpendicular to each other for the sake of convenience of explanation. Further, the upper side of FIGS. 1, 3A, 3B, 8, 9A, and 9B is referred to as a "top (upper side)" or a "tip," and the lower side is referred to as a "bottom (lower side)" or a "base end." Further, the plan view viewed from the Z-axis direction is also referred to as simply a "plan view."

The resonator 100 shown in FIGS. 1 and 2 has a resonator element 200 and a package (base) 400 housing the resonator element 200. Hereinafter, the resonator element 200, and the package 400 will sequentially be explained in detail.

The package 400 has a base substrate 410 of a cavity type having a recessed section 411 opening upward, and a lid (a lid body) 420 bonded to the base substrate 410 so as to cover the opening of the recessed section 411, and houses the resonator element 200 in the internal space S thereof. It should be noted that the internal space S is preferably sealed airtightly.

As shown in FIGS. 1 and 2, the base substrate 410 is formed of a material having an insulating property. Such a material is not particularly limited, and a variety of types of ceramics such as oxide ceramics, nitride ceramics, or carbide ceramics can be used. Meanwhile, the lid 420 is preferably formed of a member having a linear expansion coefficient similar to that of the constituent material of the base substrate 410. In the case in which the ceramics described above is used as the constituent material of the base substrate 410, an alloy such as kovar can be used as such a material.

The bottom surface of the recessed section 411 is provided with two connection electrodes 431, 432, and the connection electrodes 431, 432 are electrically connected to mounting electrodes 433, 434 formed on the lower surface of the base substrate 410 via penetration electrodes and inter-layer wiring not shown, respectively.

It should be noted that the base substrate 410 can have a plate-like shape, and in such a case, the lid 420 preferably has a concave cap shape in order to form the internal space S.

As shown in FIG. 1, the resonator element 200 has a vibrating substrate 210, and electrodes 300 used for driving and formed on the vibrating substrate 210. Further, as shown in FIG. 7, the electrodes 300 include a plurality of first driving electrodes 310, wiring lines 320, 330, 340, and 350 for connecting the plurality of first driving electrodes 310 to each other, a plurality of second driving electrodes 360, and wiring lines 370, 380, and 390 for connecting the plurality of second driving electrodes 360 to each other.

The vibrating substrate 210 is formed of quartz crystal, in particular Z-cut quartz crystal plate, for example, as a piezo-electric plate. Thus, the resonator element 200 can exert superior vibration characteristics. It should be noted that the Z-cut quartz crystal plate is a quartz crystal substrate having the Z axis (the light axis) of the quartz crystal along the thickness direction. Although it is preferable for the Z axis to coincide with the thickness direction of the vibrating substrate 210, it results that the Z axis is tilted slightly with respect to the thickness direction from the viewpoint of reducing the frequency-temperature variation in the vicinity of the room temperature.

In other words, assuming that the tilt angle is θ degree (−5≤θ15 degrees), an orthogonal coordinate system is composed of an X axis as an electrical axis, a Y axis as a mechanical axis, and a Z axis as an optical axis, a Z' axis is an axis obtained by tilting the Z axis as much as θ degree so that the +Z side of the Z axis is rotated toward the −Y direction of the Y axis taking the X axis of the orthogonal coordinate system as a rotational axis, a Y' axis is an axis obtained by tilting the Y axis as much as θ degree so that the +Y side of the Y axis is rotated toward the +Z direction (a third direction) of the Z axis taking the X axis as the rotational axis, the vibrating substrate 210 having a thickness in a direction along the Z' axis and a surface including the X axis and the Y' axis as a principal surface is obtained.

The vibrating substrate 210 has a base section 220, two vibrating arms 230, 240 projecting from the base section 220 in the +Y-axis direction (a first direction) and arranged in the X-axis direction, and a support arm 250 projecting from the base section 220 in the +Y-axis direction, and located between the two vibrating arms 230, 240.

As shown in FIGS. 1 and 2, the vibrating substrate 210 has a roughly plate-like shape spreading in the X-Y plane, and having a thickness in the Z-axis direction. The thickness (the thickness of the vibrating arms 230, 240) D of the vibrating substrate 210 is not particularly limited, but is preferably smaller than 70 μm, and is in particular preferably no larger than 60 μm. By setting the thickness to be in such ranges as described above, in the case in which, for example, the base section 220 is formed (patterned) using a wet-etching process, it is possible to effectively prevent an unwanted part (a part which should normally be removed) from remaining in the boundary part between the vibrating arms 230, 240 and the base section 220, the boundary part of the hummer heads 260, 270 as weight sections described later, and so on. Therefore, it is possible to make the resonator element 200 capable of effectively reducing the vibration leakage. From a different point of view, the thickness D is preferably no smaller than 70 μm and no larger than 300 μm, and is more preferably no smaller than 100 μm and no larger than 300 μm. By setting the thickness D to be in such ranges described above, since the electrodes 300 can widely be formed on the side surfaces of the vibrating substrate 210, the CI-value can be decreased.

The base section 220 of the present embodiment has a narrowed portion 221 having a width gradually decreasing toward the −Y-axis direction disposed on the opposite side to the arms 230, 240, and 250. Further, the narrowed portion 221 has a width (a length along the X-axis direction (a second direction)) gradually decreasing as the distance from the vibrating arms 230, 240 increases. Since such a narrowed portion 221 is provided, the vibration leakage of the resonator element 200 can effectively be suppressed.

The specific explanation thereof will be as follows. It should be noted that in order to simplify the explanation, it is assumed that the shape of the resonator element 200 is symmetrical about a predetermined axis parallel to the Y axis.

Firstly, as shown in FIG. 3A, the case in which the narrowed portion 221 is not provided will be explained. In the case in which the vibrating arms 230, 240 are flexurally deformed so that the distance between the vibrating arms 230, 240 increases, a displacement similar to the rotational motion in a clockwise direction occurs as indicated by the arrows in the base section 220 in the vicinity of an area to which the vibrating arm 230 is connected, and a displacement similar to the rotational motion in a counterclockwise direction occurs as indicated by the arrows in the base section 220 in the vicinity of an area to which the vibrating arm 240 is connected (it should be noted that the motions cannot be called rotational motions in a precise sense, and are therefore referred to as the motions "similar to the rotational motions" for descriptive purposes). The X-axis direction components of these displacements are in the directions opposite to each other, and are therefore canceled out with each other in a central portion of the base section 220 in the X-axis direction, and it results that the displacement in the +Y-axis direction remains (it should be noted that the displacement in the Z-axis direction also remains, but is omitted here). Specifically, in the base section 220, the central portion in the X-axis direction is flexurally deformed so as to be displaced in the +Y-axis direction. If an adhesive is formed in a central portion in the Y-axis direction of the part having the displacement in the +Y-axis direction, and the part is fixed to the package via the adhesive, elastic energy due to the displacement in the +Y-axis direction is leaked to the outside via the adhesive. This loss is called a vibration leakage, causes deterioration of the Q-value, and as a result, leads to deterioration of the CI-value.

In contrast, in the case in which the narrowed portion 221 is provided as shown in FIG. 3B, since the narrowed portion 221 has an arch-like (curved) contour, it results that the displacements similar to the rotational motions described above block each other in the narrowed portion 221. In other words, in the central portion in the X-axis direction of the narrowed portion 221, the displacements in the X-axis direction are canceled out with each other similarly to the central portion in the X-axis direction of the base section 220, and it results that the displacement in the Y-axis direction is suppressed due to the cancellation. Further, since the narrowed portion 221 has the arch-like contour, it results that the displacement in the +Y-axis direction, which is urged to occur in the base section 220 is also suppressed. As a result, the displacement in the +Y-axis direction of the central portion in the X-axis direction of the base section 220 caused in the case in which the narrowed portion 221 is provided becomes far smaller compared to the case in which the narrowed portion 221 is not provided. In other words, a resonator element small in vibration leakage can be obtained.

It should be noted that although the contour of the narrowed portion 221 has the arch-like shape, the shape is not limited to this shape providing the function described above is exerted. It is also possible to adopt, for example, a narrowed portion shrunk along the predetermined axis in a stepwise manner, and formed to have a contour formed of a plurality of straight lines to have a shape of steps (a stepped shape), a narrowed portion having a width decreasing linearly (continuously) along the predetermined axis described above in a plan view, and formed to have a contour formed of two straight lines in a mound shape (a triangular shape), a narrowed portion having a width decreasing linearly (continuously) along the predetermined axis in a plan view, and formed to have a contour formed of three or more straight lines, and so on.

The vibrating arms 230, 240 are arranged in the X-axis direction (the second direction), and extend from the upper end of the base section 220 in the Y-axis direction (the first direction) so as to be parallel to each other. The vibrating arms 230, 240 have arm sections 261, 271, and hammerheads (widened portions) 260, 270 as weight sections disposed at the tips of the arm sections 261, 271, respectively.

By applying an alternating voltage between first and second driving electrodes 310, 360 described later, the vibrating arms 230, 240 alternately repeat getting closer to and getting away from each other along the X-axis direction (the second direction) to flexurally vibrate in the in-plane direction.

Further, as shown in FIGS. 1 and 4, the vibrating arm 230 is provided with a groove 235 having a bottom and opening in one principal surface 231, and a groove 236 having a bottom and opening in the other principal surface 232. Similarly, the vibrating arm 240 is provided with a groove 245 having a bottom and opening in one principal surface 241, and a groove 246 having a bottom and opening in the other principal surface 242. These grooves 235, 236, 245, and 246 are disposed so as to extend in the Y-axis direction, and have the same shape as each other. Therefore, the vibrating arms 230, 240 each have a roughly "H" shaped lateral cross-sectional shape. By forming such grooves 235, 236, 245, and 246, it becomes difficult for the heat generated by the flexural vibration to diffuse (make heat conduction), and a thermoelastic loss can be suppressed in the heat insulating area, which is an area where the flexural vibration frequency (the mechanical flexural vibration frequency) f is higher than a thermal relaxation frequency f0 (f>f0).

Hereinafter, this phenomenon will specifically be explained using the vibrating arm 230 as an example.

The vibrating arm 230 flexurally vibrates in the in-plane direction by applying the alternating voltage between the first and second driving electrodes 310, 360 described later. As shown in FIG. 5, in this flexural vibration, a side surface 234 extends when a side surface 233 of the vibrating arm 230 contracts, and in contrast, the side surface 234 contracts when the side surface 233 extends. Since the temperature of the contracting surface rises, and the temperature of the extending surface drops among the side surfaces 233, 234, a temperature difference occurs between the side surface 233 and the side surface 234, namely in the inside of the vibrating arm 230. A vibration energy loss occurs due to the heat transfer caused by such a temperature difference, and thus, the Q-value of the resonator element 200 drops. Such an energy loss due to the drop of the Q-value as described above is called a thermoelastic loss.

In the case in which the flexural vibration frequency (the mechanical flexural vibration frequency) f of the vibrating arm 230 varies in the resonator element having such a configuration as in the resonator element 200 and vibrating in the flexural vibration mode, the Q-value takes the minimum value when the flexural vibration frequency of the vibrating arm 230 coincides with the thermal relaxation frequency fm. The thermal relaxation frequency fm can be obtained as fm=1/(2πτ) (it should be noted that π represents the circular constant, and assuming that e represents the Napier's constant, τ represents the relaxation time necessary for the temperature difference to be a value obtained by being multiplied by e-1).

Further, assuming that the thermal relaxation frequency in the case in which the vibrating arm 230 is assumed to have a plate structure (a structure having a rectangular cross-sectional shape) is fm0, the thermal relaxation frequency fm0 can be obtained by the following formula.

$$fm0=\pi k/(2\rho C p a^2) \quad (1)$$

It should be noted that π represents the circular constant, k denotes the thermal conductivity of the vibrating arm 230 in the vibration direction, τ represents the mass density of the vibrating arm 230, Cp represents the thermal capacity of the vibrating arm 230, and a represents the width (the effective width) of the vibrating arm 230 in the vibration direction. In the case of inputting the constants of the raw material (i.e., a quartz crystal) of the vibrating arm 230 in the thermal conductivity k, the mass density ρ, and the thermal capacity Cp in Formula (1), the thermal relaxation frequency fm0 obtained from the formula corresponds to the value of the case in which the grooves 52, 53 are not provided to the vibrating arm 230.

As shown in FIG. 5, in the vibrating arm 230, there are formed the grooves 235, 236 so as to be located between the side surfaces 233, 234. Therefore, the heat transfer path for achieving the temperature equilibration over the temperature difference, which is caused between the side surfaces 233, 234 in the flexural vibration of the vibrating arm 230, using the heat transfer is formed so as to circumvent the grooves 55, 56, and is made longer than the direct distance (the shortest distance) between the side surfaces 233, 234. Therefore, the relaxation time τ is made longer compared to the case in which the grooves 235, 236 are not provided to the vibrating arm 230, and thus, the thermal relaxation frequency fm drops.

FIG. 6 is a graph showing dependency of the Q-value on the value f/fm of the resonator element in the flexural vibration mode. In the drawing, the curve F1 indicated by the dotted line represents the case (the case in which the vibrating arm has an H-type lateral cross-sectional shape) in which the grooves are provided to the vibrating arm as in the case of the resonator element 200, and the curve F2 indicated by the solid line represents the case (the case in which the vibrating arm has a rectangular lateral cross-sectional shape) in which no groove is provided to the vibrating arm.

As shown in FIG. 6, although the shapes of the curves F1, F2 are not different from each other, the curve F1 is shifted toward the lower frequency side from the curve F2 due to the drop of the thermal relaxation frequency fm described above. Therefore, if the relationship of f/fm>1 is fulfilled, the Q-value of the resonator element having the vibration arm provided with the grooves is always higher than the Q-value of the resonator element having the vibrating arm not provided with the grooves.

It should be noted that in FIG. 5, the area where the relationship of f/fm<1 is fulfilled is also referred to as an isothermal region, and in the isothermal region, the Q-value rises as the value f/fm decreases. This is because the temperature difference inside the vibrating arm described above becomes difficult to occur as the mechanical frequency of the vibrating arm drops (the vibration speed of the vibrating arm decreases). On the other hand, the area where the relationship of f/fm>1 is fulfilled is also referred to as an adiabatic region, and in the adiabatic region, the Q-value rises as the value f/fm increases. This is because as the mechanical frequency of the vibrating arm rises, the speed of switching between temperature rise and temperature drop in each of the side surfaces rises to a high level, and thus the time for the heat transfer described above to occur runs out. For this reason, the phrase "the relationship of f/fm>1 is fulfilled" can also be rephrased as "the value f/fm exists in the adiabatic region."

It should be noted that since a constituent material (a metal material) of the first and second driving electrodes 310, 360 described later is high in thermal conductivity compared to a quartz crystal as a constituent material of the vibrating arms 230, 240, the heat transfer via the first driving electrode 310 is actively performed in the vibrating arm 230, and the heat transfer via the second driving electrode 360 is actively performed in the driving arm 240. If such heat transfer via the first and second driving electrodes 310, 360 is actively performed, the relaxation time τ is inevitably shortened. Therefore, in the vibrating arm 230, the first driving electrode 310 is divided into apart on the side surface 233 side and a part on the side surface 234 side in the bottom surfaces of the grooves 235, 236, and in the vibrating arm 240, the second driving electrode 360 is divided into apart on the side surface 243 side and a part on the side surface 244 side in the bottom surfaces of the grooves 235, 236, and thus the heat transfer described above is prevented or inhibited from occurring. As a result, the relaxation time τ can be prevented from being shortened, and thus the resonator element 200 having a higher Q-value can be obtained.

Further, the length of the grooves 235, 236 is not particularly limited, and the tips of the grooves 235, 236 are not required to extend to the hammerhead 260. However, if the tips of the grooves 235, 236 extend to the hammerhead 260, the stress concentration generated in the periphery of the tips of the grooves is relaxed, and therefore, the possibility of the breakage or the chip caused when an impact is applied is reduced. Further, due to the base end of each of the grooves 235, 236 extending to the base section 220, the stress concentration in the boundary sections of these constituents can be relaxed. Therefore, the possibility of the breakage and the chip caused when an impact is applied is reduced.

As shown in FIG. 5, the depth of the grooves 235, 236 is not particularly limited, but it is preferable that, assuming that the depth of the groove 235 is D1, the depth of the groove 236 is D2 (in the present embodiment, D1=D2), the relationship: 60%≤(D1+D2)/D<100% is fulfilled.

Since the heat transfer path is elongated by fulfilling such a relationship as described above, the reduction of the thermoelastic loss can effectively be achieved in the adiabatic region.

It should be noted that it is preferable for the grooves 235, 236 to be formed with the positions of the grooves 235, 236 adjusted in the X-axis direction with respect to the position of the vibrating arm 230 so that the centroid of the cross-sectional surface of the vibrating arm 230 coincides with the center of the cross-sectional shape of the vibrating arm 230. By adopting such a configuration, an unwanted vibration (specifically, an oblique vibration having an out-of-plane component) of the vibrating arm 230 is reduced, and therefore, the vibration leakage can be reduced. Further, in this case, since it results that the phenomenon of also driving an unnecessary vibration is reduced, the drive area is relatively increased to make it possible to decrease the CI-value.

Further, assuming that the width (the length in the X-axis direction) of bank sections (parts of the principal surface arranged along the width direction perpendicular to the longitudinal direction of the vibrating arm 230 across the groove 235) 231a located on the both sides in the X-axis direction of the groove 235 of the principal surface 231 and bank sections 232a located on the both sides in the X-axis direction of the groove 236 of the principal surface 232 is W3, the relationship: 0 μm<W3≤20 μm is preferably fulfilled. Thus, the CI-value of the resonator element 200 is lowered to a sufficiently low level. Among the numerical range described above, the relationship: 5 μm<W3≤9 μm is preferably fulfilled. Thus, in addition to the advantage described above, the thermoelastic loss can be reduced. Further, it is also preferable to fulfill the following relationship: 0 μm<W3≤5 μm. Thus, the CI-value of the resonator element 200 can further be lowered.

As shown in FIG. 1, the hammerhead 260 has a roughly rectangular shape having the X-axis direction as the longitudinal direction in the X-Y planar view. Assuming that the total length (the length in the Y-axis direction) of the vibrating arm 230 is L, and the length (the length in the Y-axis direction) of the hammerhead 260 is H1, the vibrating arm 230 fulfills the relationship: 0.012<H1/L<0.3. Although not particularly limited so long as the above relationship is fulfilled, it is further preferable to fulfill the relationship: 0.046<H1/L<0.223. Since the CI-value of the resonator element 200 is suppressed to a low level by fulfilling the relationship described above, the resonator element 200 small in vibration loss and having a superior vibration characteristic is obtained. Here, in the present embodiment, the base end of the vibrating arm 230 is set to a place located at the center of the width (the length in the X-axis direction) of the vibrating arm 230 on a line segment connecting the place where the side surface 234 is connected to the base section 220 and the place where the side surface 233 is connected to the base section 220.

It should be noted that the hammerheads 260, 270 as the weight sections are formed as the widened portions larger in the length along the X-axis direction than the arm sections 261, 271, but are not limited to this configuration, and are only required to be higher in mass density per unit length than the arm sections 261, 271. For example, it is possible to adopt a configuration in which the weight sections are the same in the length along the X-axis direction as the arm sections 261, 271, and are larger in the thickness along the Z-axis direction than the arm sections. Further, the weight sections can also be formed by thickly disposing metal such as Au on the surfaces of the arm sections 261, 271 corresponding to the weight sections. Further, the weight sections can be formed of a material higher in mass density than the arm sections 261, 271.

Further, assuming that the width (the length in the X-axis direction) of the arm section 261 is W1, and the width (the length in the X-axis direction) of the hammerhead 260 is W2, the vibrating arm 230 preferably fulfills the relationship: 1.5≤W2/W1≤10.0. Further, it is more preferable for the vibrating arm 230 to fulfill the relationship: 1.6≤W2/W1≤7.0. By fulfilling such relationships described above, it is possible to ensure the large width of the hammerhead 260, and at the same time, to prevent the vibrating arm 230 from twisting. Therefore, even if the length H1 of the hammerhead 260 is relatively short (smaller than 30% of the total length L of the vibrating arm 230) as described above, the mass effect of the hammerhead 260 can sufficiently be exerted. Therefore, by fulfilling the relationship: 1.5≤W2/W1≤10.0, it is possible to suppress the total length L of the vibrating arm 230 to thereby achieve the miniaturization of the resonator element 200.

As described above, by fulfilling the following relationships in the vibrating arm 230, the resonator element 200 small in size and having the CI-value sufficiently suppressed can be obtained due to the synergistic effect of the two relationships: 0.012<H1/L<0.3 and 1.5≤W2/W1≤10.0.

It should be noted that by limiting the total length L to L≤2 mm or preferably to L≤1 mm, there can be obtained a small-sized resonator element used for an oscillator to be installed in a device such as portable music equipment or an IC card. Further, by limiting the width W1 to W1≤100 μm or preferably to W1≤50 μm, it is possible to obtain the resonator element resonating at a low frequency to be used in an oscillator circuit for realizing the low power consumption even in the range of the total length L described above. Further, in the adiabatic region, in the case in which the vibrating arm extends in the Y-axis direction and vibrates flexurally in the X-axis direction in the Z-cut quartz crystal plate, the width W1 preferably fulfills W1≤12.8 μm, in the case in which the vibrating arm extends in the X-axis direction and vibrates flexurally in the Y-axis direction in the Z-cut quartz crystal plate, the width W1 preferably fulfills W1≥14.4 μm, and in the case in which the vibrating arm extends in the Y-axis direction and vibrates flexurally in the Z-axis direction in the X-cut quartz crystal plate, the width W1 preferably fulfills W1≥15.9 μm. Since the adiabatic region is surely obtained by adopting the configuration described above, the thermoelastic loss is decreased due to the formation of the grooves to thereby improve the Q-value, and in addition, by performing driving in the region where the grooves are formed (where the electrical field efficiency is high, and the drive area can be earned), the CI-value is lowered.

Further, the hammerheads 260, 270 are disposed as adjacent as possible to each other to the extent that the hammerheads 260, 270 do not have contact with each other when vibrating the resonator element 200 at a desired flexural vibration frequency. The hammerhead 260 and the hammerhead 270 are preferably disposed so that the distance H2 (see FIG. 1) between the hammerhead 260 and the hammerhead 270 fulfills the relationship: 0.033D (μm)≤H2≤0.489D (μm).

Hereinafter, a method of calculating the relational expression described above will be explained.

Here, assuming that the time necessary to penetrate the Z-cut quartz crystal plate with the thickness D (μm) using a wet-etching process is t1 (minute), the time for which the Z-cut quartz crystal plate is actually processed is t2 (minute), and a sum of the amounts (the side-etching amounts) of the Z-cut quartz crystal plate etched in the ±X-axis directions for the time t2 is ΔX (μm), the sum ΔX can be expressed using a predetermined coefficient k as ΔX=t2/t1×D×k. In the case in which t1=t2 is assumed in this expression, Formula (2): ΔX=D×k is obtained.

Therefore, the wet-etching process is performed on the obverse and reverse principal surfaces until the Z-cut quartz crystal plate with the thickness D=100 (μm) is actually penetrated, and then, the wet-etching process is terminated at the moment when the penetration is completed. According to the measurement of the sum ΔX at that moment, the sum ΔX is 1.63 (μm). By substituting the measured value into Formula (2), the coefficient k is calculated as k=0.0163. By reducing the coefficient to the case of performing the wet-etching process on one of the principal surfaces, the coefficient can be calculated as k=0.0326.

Further, in the case of forming the resonator element 200, it is preferable to fulfill the condition of Formula (3): 2≤t2/t1≤30, so that the cross-sectional shapes of the vibrating arms 230, 240 are highly symmetric to thereby suppress the vibration leakage. Based on Formula (3) and Formula (2), in the case of performing the wet-etching process on the obverse and reverse principal surfaces, the formula: 0.033D (μm) ≤H2≤0.489D (μm) can be obtained. Further, in the case of performing the wet-etching process on one of the principal surfaces, the formula: 0.065D (μm)≤H2≤0.978D (μm) can be obtained. It should be noted that since it is preferable to decrease the sum ΔX by performing the wet-etching process on the obverse and reverse principal surfaces from the viewpoint of further miniaturizing the resonator element 200, the relational expression: 0.033D (μm)≤H2≤0.489D (μm) described above is derived.

It should be noted that the relational expression representing the preferable condition of the distance H2 explained hereinabove can directly be applied to the distance H3 (see FIG. 1) between the support arm 250 and the hammerheads 260, 270 without modifications.

The support arm 250 has a strip shape (a plate shape), and extends from the base section 220 in the +Y-axis direction, and is positioned between the vibrating arms 230, 240. The support arm 250 has a part to be attached to the package 400 via electrically-conductive adhesives 451, 452 as fixation materials. Since the support arm 250 is disposed, it is possible to eliminate a fixing region, namely a part to be bonded to the electrically-conductive adhesives 451, 452, from the base section 220, and thus, the miniaturization of the resonator element 200 can be achieved.

Further, the support arm 250 has a tip portion (a first portion) 251 having a roughly constant width (the length in the X-axis direction), and the width-decreasing portion (a second portion) 252 disposed on the base end side of the tip portion 251 and having an average width smaller than the average width of the tip portion 251. Since the width-decreasing section 252 is disposed, in the resonator element 200, it is possible to keep the resonant frequency in the X-common mode away from the resonant frequency in the main mode toward the lower frequency side. Thus, it is possible to prevent the vibration in the X-common mode from being mixed to the vibration in the main mode. Therefore, the resonator 100 having excellent vibration characteristics can be obtained. It should be noted that although in FIG. 1, the width-decreasing portion 252 has a shape formed by hollowing out the support arm 250 from the ±X directions to form circular arc shapes in a planar view, the shape is not limited thereto. If an area having a constant width smaller than the average width of the tip portion 251 is provided to the width-decreasing portion 252, the resonant frequency in the X-common mode can further be kept away from the resonant frequency in the main mode toward the lower frequency side. Further, by adopting the width-decreasing portion 252 configured including a part having a width gradually increasing in the +Y direction disposed at an end portion on the +Y side of a part having a constant width smaller than the average width of the tip portion 251, and a part having a width gradually increasing in the −Y direction disposed at the other end portion on the −Y side of the part, it is possible to prevent the stress from being concentrated into the boundary between the width-decreasing portion 252 and the tip portion 251 and the boundary between the width-decreasing portion 252 and the base section 220 when an impact is applied, and thus, the possibility of the breakage can be reduced.

The tip portion 251 has a strip shape, and is provided with a recessed section 254 opening in a contact area with which the electrically-conductive adhesive 451 has contact, and a pair of notches 256 respectively disposed on the both side surfaces.

As shown in FIGS. 1, 2, 9A, and 9B, the recessed section 254 has a quadrangular shape in a planar view of the lower surface of the tip portion 251. On an inner side surface of the recessed section 254, there is disposed a connection section 351 described later.

The pair of notches 256 are portions disposed midway in the longitudinal direction of the tip portion 251, and formed by notching the both side surfaces to have roughly V shapes in a planar view of the tip portion 251.

The width (the smallest width) W5 of the width-decreasing portion 252 is preferably 20 through 50% of the width (the average width) W4 of the tip portion 251, and further preferably 25 through 45% thereof (see FIG. 3B). Thus, the resonant frequency in the X-common mode can more surely be kept away from the resonant frequency in the main mode, and at the same time, the possibility of the breakage of the width-decreasing portion 252 due to an impact can be reduced. Therefore, the resonator 100 stably exerting more excellent vibration characteristics can be obtained.

Further, on the side surfaces of the vibrating substrate 210 including the both side surfaces of the width-decreasing portion 252, there are formed a pair of projecting sections 253 projecting in the X-axis direction midway in the Z-axis direction of the side surfaces. The projecting sections 253 can be formed of, for example, fins generated when forming the resonator element 200 using the wet-etching process.

The vibrating substrate 210 is hereinabove explained. Then, the electrodes 300 formed on the vibrating substrate 210 will be explained.

The first driving electrodes 310 are respectively formed on the inner side surfaces of the grooves 235, 236 of the vibrating arm 230, and the side surfaces 243, 244 of the vibrating arm 240. The first driving electrode 310 on the groove 235 is connected to the first driving electrode 310 on the side surface 244 via the wiring line 320 formed straddling the upper surface and the side surface of the base section 220, and the first driving electrode 310 on the groove 236 is connected to the first driving electrode 310 on the side surface 244 via the wiring line 330 formed straddling the lower surface and the side surface of the base section 220. Further, the first driving electrode 310 on the side surface 244 is connected to the first driving electrode 310 on the side surface 243 via the wiring line 340 formed on the hammerhead 270. A tip portion of the wiring line 350 constitutes a connection section (a first conductive pad) 351 for achieving electrical connection to the connection electrode 431 via the electrically-conductive adhesive 451 described later. The connection section 351 is formed on the inner side surface and the peripheral portion of the recessed section 254 of the support arm 250.

The wiring line 350 extends from the side surface 243 to an upper surface of the base section 220, and then further extends to the tip of the support arm 250 via the upper surface of the support arm 250. Further, the wiring line 350 extends to a lower surface of the support arm 250 via a tip surface of the support arm 250. The wiring line 350 is disposed so as to cover the tip surface of the support arm 250, and at the same time covers the side surfaces on the ±X-axis sides of the tip portion (a portion of the support arm 250 on the +Y-axis side of the width-decreasing portion), but is not limited to this configuration. It is sufficient for the wiring line 350 to be formed in a partial area of at least one of the tip surface of the support arm 250, the side surface of the tip portion on the +X-axis side, and the side surface of the tip portion on the −X-axis side providing the wiring line 350 extending on the upper surface of the base section 220 and the connection section 351 are electrically connected to each other.

On the other hand, the second driving electrodes 360 are respectively formed on the side surfaces 233, 234 of the vibrating arm 230, and the inner surfaces of the grooves 245, 246 of the vibrating arm 240. The second driving electrode 360 on the groove 245 is connected to the second driving electrode 360 on the side surface 233 via the wiring line 370 formed on the upper surface of the base section 220, and the second driving electrode 360 on the groove 246 is connected to the second driving electrode 360 on the side surface 233 via the wiring line 380 formed on the lower surface of the base section 220. Further, the second driving electrode 360 formed on the side surface 233 is connected to the second driving electrode 360 formed on the side surface 234 via the wiring line 390 formed on the hammerhead 260.

Further, the wiring line 380 is branched into two parts 380', 380" on the lower surface of the base section 220, and one part 380' thus branched is connected to the second driving electrode 360 on the side surface 233 as described above, and the other part 380" extends toward the width-decreasing portion 252 of the support arm 250. Further, a tip portion of the part 380" is located in the width-decreasing portion 252, and is increased in width compared to the other part, and constitutes a connection section (a conductive pad) 381 for achieving the electrical connection to the connection electrode 432 via the electrically-conductive adhesive 452.

The constituent material of the electrodes 300 is not particularly limited, and a metal material such as gold (Au), gold alloy, platinum (Pt), aluminum (Al), aluminum alloy, silver (Ag), silver alloy, chromium (Cr), chromium alloy, copper (Cu), molybdenum (Mo), niobium (Nb), tungsten (W), iron (Fe), titanium (Ti), cobalt (Co), zinc (Zn), or zirconium (Zr), and an electrically-conductive material such as indium tin oxide (ITO) can be used.

The resonator element 200 is hereinabove explained. When applying an alternating voltage between the connection sections 361, 281 (the first and second driving electrodes 310, 360), such a resonator element 200 as described above vibrates in a vibration mode in which the vibrating arms 230, 240 flexurally vibrate at a predetermined frequency in an in-plane direction (in the direction of the X-Y plane) so as to repeat getting closer to and getting away from each other. This vibration mode is referred to as the main mode. In some cases, a vibration in a spurious mode such as a Z-reversed phase mode or the X-common mode is combined with the vibration in the main mode, and the vibration mode in the main mode and the vibration mode in the spurious mode are mixed with each other. Due to the mixture of the spurious mode with the main mode, the vibration characteristics of the resonator 100 are degraded. This is because there is adopted a structure in which the vibration leakage with respect to the vibration mode in the spurious mode is not suppressed although the vibration leakage in the main mode is decreased to a lowest possible level, and therefore, the vibration leakage is increased when the resonator 100 vibrates in the main mode, and thus, there are caused the deterioration of the Q-value and the deterioration of the CI-value due to the deterioration of the Q-value.

In order to prevent the above phenomenon, the resonant frequency in the main mode is distant from the resonant frequency in the spurious mode preferably no smaller than 10%, and more preferably no smaller than 14.7%. Further, it is preferable for the CI-value in the main mode to be sufficiently lower than the CI-value in the spurious mode.

Incidentally, as shown in FIGS. 1, 2, and 7, the resonator 100 is provided with the electrically-conductive adhesives 451, 452 disposed separately from each other, and for fixing the resonator element 200 to the package 400. The electrically-conductive adhesives 451, 452 each have a conductive property, and are arranged along the Y-axis direction. Thus, it is possible to stably fix the resonator element 200 to the package 400, and at the same time, to suppress the vibration leakage of the resonator element 200.

The electrically-conductive adhesive 451 has contact with the connection electrode 431 and the connection section 351 to electrically connect the connection electrode 431 and the connection section 351 to each other. Further, the electrically-conductive adhesive 451 overlaps a tip portion of the lower surface of the support arm 250.

On the other hand, the electrically-conductive adhesive 452 is disposed on the base end side of the electrically-conductive adhesive 451, and has contact with the connection electrode 432 and the connection section 381 to electrically connect the connection electrode 432 and the connection section 381 to each other. The electrically-conductive adhesive 452 has contact with the width-decreasing portion 252. Specifically, the electrically-conductive adhesive 452 is disposed in an area between the tip portion of the support arm 250 and the base section 220, or disposed so as to include the area, and has no contact with the lower surface of the base section 220. Thus, the vibration leakage of the resonator element 200 can more surely be suppressed, and at the same time, the miniaturization can be achieved. This is because the electrically-conductive adhesives are sufficiently soft compared to the quartz crystal, and thus the effect (the effect of separating the resonant frequency in the X-common mode from the resonant frequency in the main mode) due to the width-decreasing portion 252 is not vitiated.

By disposing the electrically-conductive adhesive 451 and the electrically-conductive adhesive 452 in such a manner as described above, the electrically-conductive adhesive 451 and the electrically-conductive adhesive 452 can be separated as much as possible, and thus, it is possible to prevent the electrically-conductive adhesive 451 and the electrically-conductive adhesive 452 from shorting.

It should be noted that as shown in FIG. 8, the electrically-conductive adhesive 452 can also be disposed on the +Y-axis side of the boundary between the support arm 250 and the base section 220. Thus, it is possible to sufficiently separate the electrically-conductive adhesive 452 from the base section 220 while sufficiently keeping the distance between the electrically-conductive adhesive 451 and the electrically-conductive adhesive 452. Therefore, it is possible to prevent not only the short-circuit between the electrically-conductive adhesive 452 and the electrically-conductive adhesive 451, but also short-circuit with the wiring lines disposed on the lower surface of the base section 220.

Further, it is preferable that the Young's modulus of the electrically-conductive adhesive 451 and the electrically-conductive adhesive 452 is lower than the Young's modulus of the resonator element 200. The Young's modulus of the electrically-conductive adhesive 451 and the electrically-conductive adhesive 452 is preferably in a range of 50 through 6000 MPa, and more preferably in a range of 100 through 5000 MPa. Thus, the vibration leakage of the resonator element 200 can more effectively be suppressed. It should be noted that in the case in which the electrically-conductive adhesives 451, 452 or the resonator element 200 is not made of an isotropic material, it is assumed that the following isotropic approximation is performed. Specifically, it is assumed that the Young's modulus E is derived as shown in Formulas (4) through (6) below using the elastic stiffness constants C11, C12, and C44.

$$\mu = \frac{1}{5}(C_{11} - C_{12} + 3C_{44}) \quad (4)$$

$$E = \frac{3\lambda + 2\mu}{\lambda + \mu}\mu \quad (5)$$

$$\lambda = \frac{1}{5}(C_{11} + 4C_{12} - 2C_{44}) \quad (6)$$

Further, as described above, the support arm 250 is provided with the recessed section 254 disposed in the contact area with which the electrically-conductive adhesive 451 has contact. Thus, a part of the electrically-conductive adhesive 451 can enter the inside of the recessed section 254. Therefore, even in the case in which an application quantity of the electrically-conductive adhesive 451 is relatively large, the electrically-conductive adhesive 451 is retained in the recessed section 254. As a result, it is possible to reduce the spread of the excess of the electrically-conductive adhesive 451 to the peripheral part. Therefore, it is possible to effectively inhibit the electrically-conductive adhesive 451 and the electrically-conductive adhesive 452 from shorting.

As shown in FIG. 7, the electrically-conductive adhesive 452 creeps up from the lower surface of the width-decreasing portion 252 along the both side surfaces, and also has contact with a part of each of the side surfaces. Thus, the vibration leakage in the second-order harmonic mode (the second-order harmonic mode in the case of assuming that the X-reversed phase flexural vibration mode as the main mode is the first order) can be increased. In other words, the vibration in the second-order harmonic mode can be released to the outside via the electrically-conductive adhesive 452. Therefore, due to the deterioration of the Q-value in the second-order harmonic mode, the CI-value of the second-order harmonic wave can be increased, and as a result, the possibility that the oscillator equipped with the resonator 100 erroneously oscillates at a frequency in the second-order harmonic mode can be reduced.

Further, the both side surfaces of the width-decreasing portion 252 are each provided with the projecting section 253. Thus, when applying the electrically-conductive adhesive 452, even in the case in which, for example, the viscosity of the electrically-conductive adhesive 452 is relatively low, it is possible to prevent the electrically-conductive adhesive 452 from flowing around to the upper surface of the width-decreasing portion 252. Therefore, it is possible to prevent the electrically-conductive adhesive 452 from having contact with the wiring line 350 and the wiring lines in the periphery of the wiring line 350. As described above, the projecting section 253 functions as a stopper section for preventing the electrically-conductive adhesive 452 from flowing around to the upper surface of the width-decreasing portion 252 (see FIG. 7).

As described above, the projecting section 253 is a fin inevitably remaining unetched when, for example, forming the resonator element 200 using the wet-etching process. By actively using the remaining fin, the manufacturing time of the resonator element 200 can be shortened, and at the same time, a contribution to the reduction of the manufacturing cost of the resonator element 200 can be made.

Further, on the tip surface (the boundary portion between the support arm 250 and the base section 220) of the base section 220, there is disposed a non-connection area. Thus, even in the case in which the electrically-conductive adhesive 451 has contact with the tip surface of the base section 220, it is possible to prevent the electrically-conductive adhesive 451 from having contact with the wiring lines disposed on the upper surface or the lower surface of the base section 220.

Further, since the pair of notches 256 are disposed, the both side surfaces of the tip portion 251 are each divided into an area 500a on the tip side and an area 500b on the base send side via corresponding one of the pair of notches 256 (see FIGS. 9A and 9B)

In the area 500a on the tip side, there is formed the wiring line 350. Further, in the area 500b on the base end side, there is formed a metal film 500, which is not electrically connected to the electrodes 300. In other words, the metal film 500 formed in the area 500b on the base end side is in an electrically floating state.

According to such a configuration as described above, it is possible to prevent the electrically-conductive adhesive 451 and the electrically-conductive adhesive 452 from shorting via the both side surfaces of the tip portion 251, and it becomes easy to manufacture the resonator element 200. Hereinafter, the reason for the latter will be explained together with the manufacturing method of the resonator element 200 with reference to FIGS. 10A through 10C. It should be noted that FIGS. 10A through 10C are each a cross-sectional view along the line C-C in FIG. 1, and this part will be cited as an example, and will be explained as a representative.

Firstly, as shown in FIG. 10A, the vibrating substrate 210 is prepared. The vibrating substrate 210 can be manufactured by patterning the Z-cut quartz crystal substrate using the wet-etching process. It should be noted that as described above, since the fins are formed on the side surfaces of the vibrating substrate 210, the both side surfaces (the surfaces connected to the notches 256) of the tip portion 251 are each tilted with respect to the X-Y plane, and can be divided into upper surfaces 257a, 258a and lower surfaces 257b, 258b.

Then, as shown in FIG. 10B, a metal film 300' is deposited on the entire surface of the vibrating substrate 210 by, for example, vapor deposition or sputtering, then a photoresist film (a positive photoresist film) is deposited on the metal film 300' and then the photoresist film is patterned by an exposure and development processes to thereby form a resist pattern corresponding to the shapes of the electrodes 300.

Here, in the exposure process, it is necessary to irradiate each of the upper surface, the lower surface, and the side surfaces of the vibrating substrate 210 with the exposure light. Among these surfaces, the exposure of the upper surface and the lower surface can easily be performed by applying the exposure light from the upper surface side and the lower surface side. In contrast, in the case of exposing the side surfaces, although it is necessary to perform an oblique exposure process of applying the exposure light obliquely from the upper surface side or the lower surface side, since the side surfaces are different in orientation from each other depending on the location, it is necessary to perform the oblique exposure a plurality of times for each of the side surfaces different in orientation from each other. Therefore, it takes a lot of troubles to form the resist pattern.

In this point, in the resonator element 200 according to the present embodiment, since the metal film 300' formed in the area 500b on the base end side of the support arm 250 is not removed but is left as the metal film 500, the oblique exposure on the side surfaces of the support arm 250 can be eliminated, and thus, the number of times of the oblique exposure can be reduced. Therefore, the reduction of the number of the forming processes of the resist pattern can be achieved, and it becomes easy to form the electrodes 300.

It should be noted that in the present embodiment, by performing the oblique exposure on the tip surfaces (the part located between the vibrating arms 230, 240 and the support arm 250) of the base section 220, the part can be formed as an electrically floating part. Thus, the short-circuit between the electrically-conductive adhesive 452 and the wiring lines disposed on the upper surface of the base section 220 can be prevented. Further, since it is sufficient for the oblique exposure to be performed once, the manufacturing process of the resonator element 200 becomes relatively easy. Further, by intentionally forming the fins on the tip surface of the base section 220, and irradiating the oblique surfaces with the exposure light, the oblique exposure can be eliminated.

Further, it is necessary to divide the metal film 300' into the area 500a on the tip side and the area 500b on the base end side. In order to realize the above, it is necessary to irradiate each of the notches 256 with the exposure light. However, since the upper surfaces 257a, 258a as the surfaces connected to the respective notches 256 are tilted, the irradiation of the corresponding part with the exposure light can be performed together with the irradiation of the upper surface with the exposure light. Similarly, since the lower surfaces 257b, 258b are tilted, the irradiation of the corresponding part with the exposure light can be performed together with the irradiation of the lower surface with the exposure light. Therefore, since the irradiation of the notches 256 with the exposure light can be performed without increasing (the number of times of) the exposure process, reduction of the number of the forming processes of the resist pattern can be achieved, and it becomes easy to form the electrodes 300.

Then, the part of the metal film 300' exposed from the resist pattern is removed by performing wet-etching via the resist pattern thus formed as described above, and then, the resist pattern is removed. According to the processes described above, the resonator element 200 can be obtained as shown in FIG. 10C.

Second Embodiment

Then, a resonator according to a second embodiment of the invention will be explained.

FIGS. 11A and 11B are plan views showing a resonator element according to the second embodiment of the invention, wherein FIG. 11A is a top view, and FIG. 11B is a bottom view (a transparent view).

Hereinafter, the resonator according to the second embodiment of the invention will be described with reference to these drawings with a focus mainly on the differences from the embodiment described above, and the explanations regarding similar matters will be omitted.

The second embodiment is substantially the same as the first embodiment except the point that the configuration of the support arm is different.

In the resonator element 200A shown in FIGS. 11A and 11B, the pair of notches 256 are eliminated. However, in the exposure process described above, by performing the oblique exposure on a part of each of the side surfaces of the support arm 250, specifically a part midway in the longitudinal direction of each of the side surfaces of the support arm 250, it is possible to remove the metal film 300' corresponding to the part to create the state in which the metal film 500 and the wiring line 350 are surely electrically blocked from each other.

Further, the process of forming the notches 256 can be eliminated, and thus, the resonator element 200A can be obtained with relative ease.

Third Embodiment

Then, a resonator according to a third embodiment of the invention will be explained.

Figure 13:
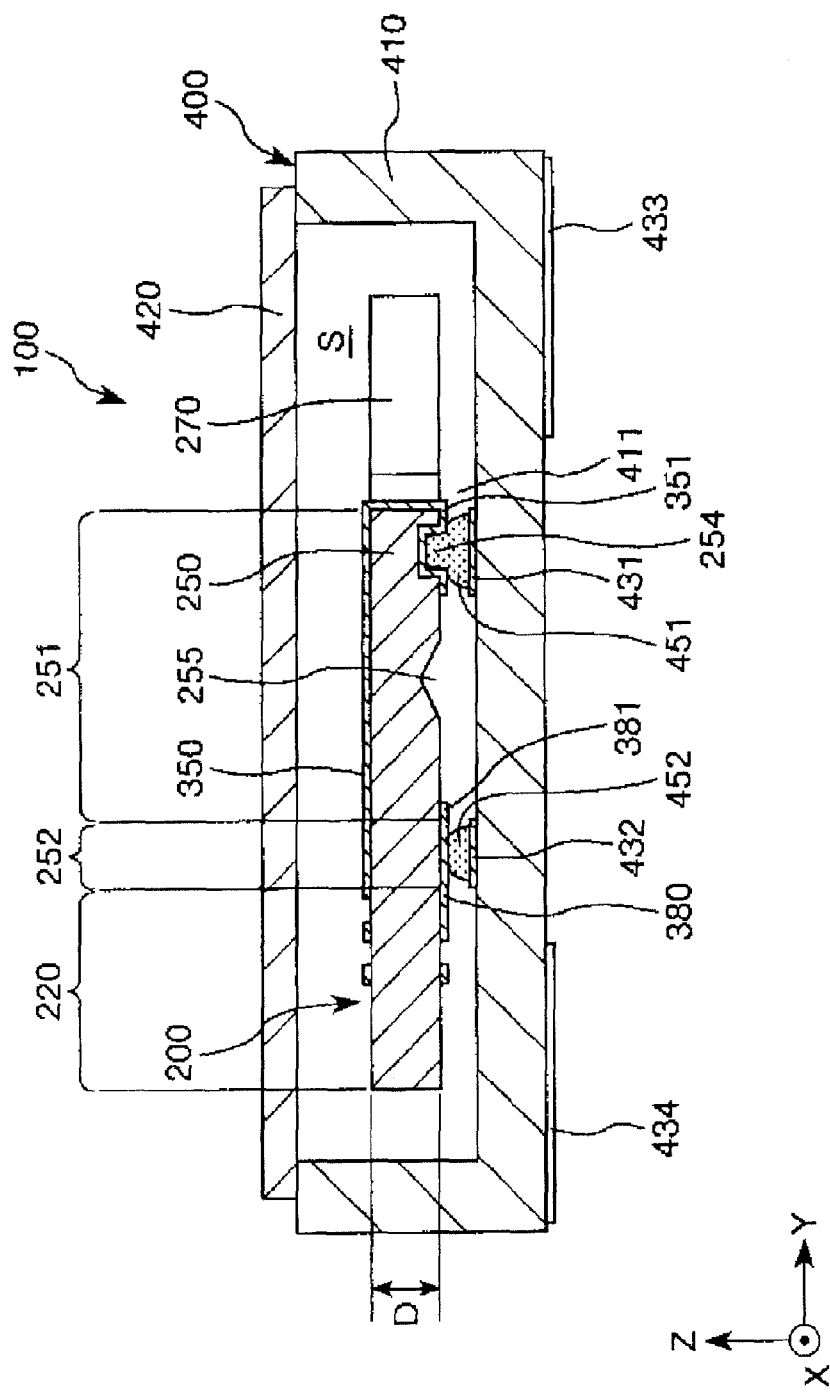
FIG. 13 is a cross-sectional view along the D-D line in FIG. 12A.

FIGS. 12A and 12B are plan views showing a resonator element according to the third embodiment of the invention, wherein FIG. 12A is a top view, and FIG. 12B is a bottom view (a transparent view). FIG. 13 is a cross-sectional view along the D-D line in FIG. 12A.

Hereinafter, the resonator according to the third embodiment of the invention will be described with reference to these drawings with a focus mainly on the differences from the embodiments described above, and the explanations regarding similar matters will be omitted.

The third embodiment is substantially the same as the first embodiment except the point that the configuration of the support arm is different.

The resonator element 200B shown in FIGS. 12A, 12B, and 13 is provided with a groove 255 disposed midway in the longitudinal direction of the tip portion 251. The groove 255 is located between the contact area with which the electrically-conductive adhesive 451 has contact and the contact area with which the electrically-conductive adhesive 452 has contact, and separates the contact areas from each other. Further, the groove 255 extends in the X-axis direction, and both ends of the groove 255 open in the both side surfaces of the tip portion 251, respectively. Thus, the contact areas can more surely be separated from each other.

It should be noted that the width (the length in the Y-axis direction) of the groove 255 is equal to the length in the Y-axis direction of the notches 256 in the present embodiment, but can be larger or smaller than the length in the Y-axis direction of the notches 256. Further, the groove 255 is formed by, for example, wet etching.

Since such a groove as described above is provided, even in the case in which an excess of the electrically-conductive adhesive 451 spreads toward the electrically-conductive adhesive 452, the excess of the electrically-conductive adhesive 451 can enter the inside of the groove 255. Therefore, it is possible to more surely prevent the electrically-conductive adhesive 451 and the electrically-conductive adhesive 452 from shorting.

Fourth Embodiment

Then, a resonator according to a fourth embodiment of the invention will be explained.

Figure 14:
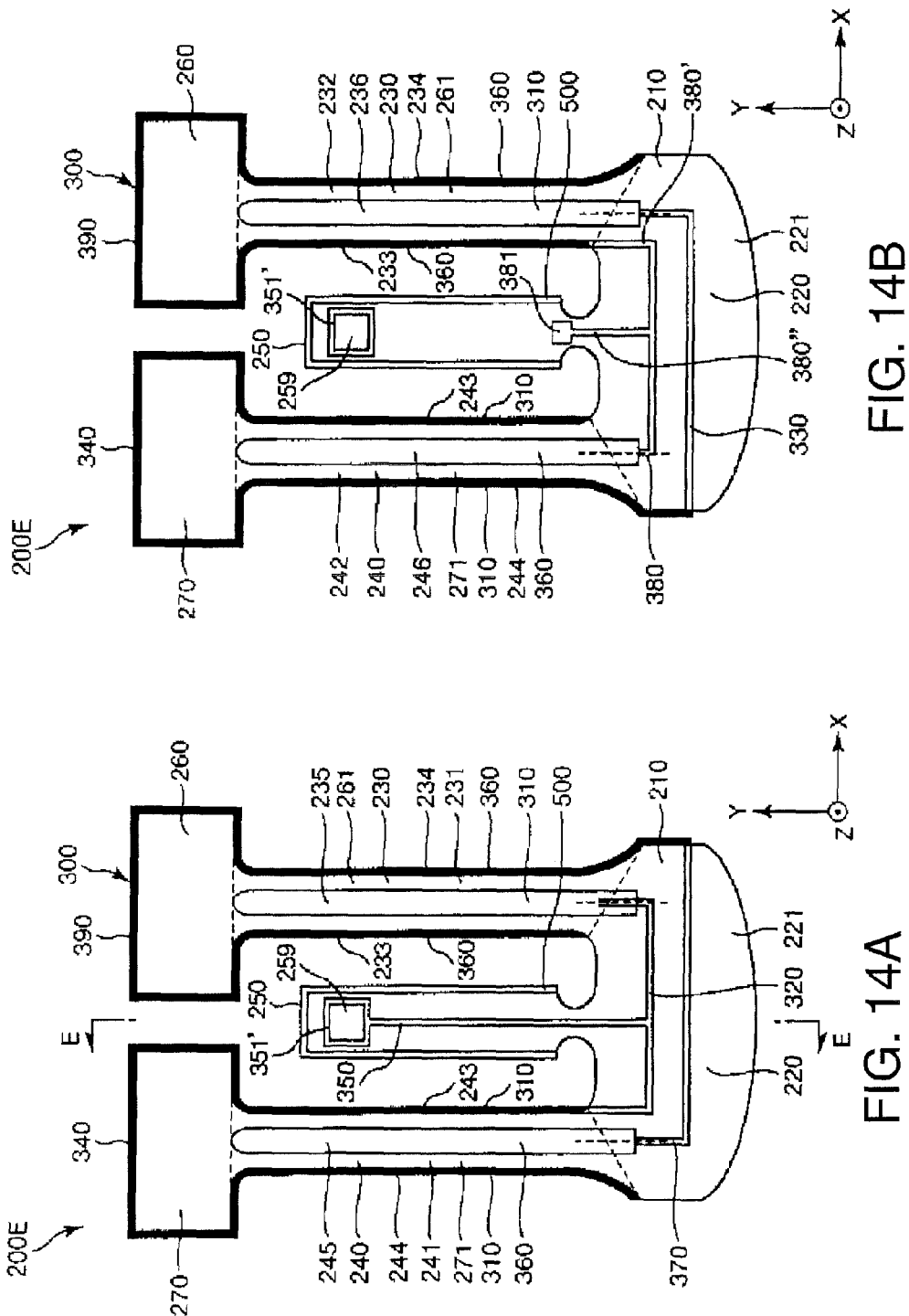
Figure 15:
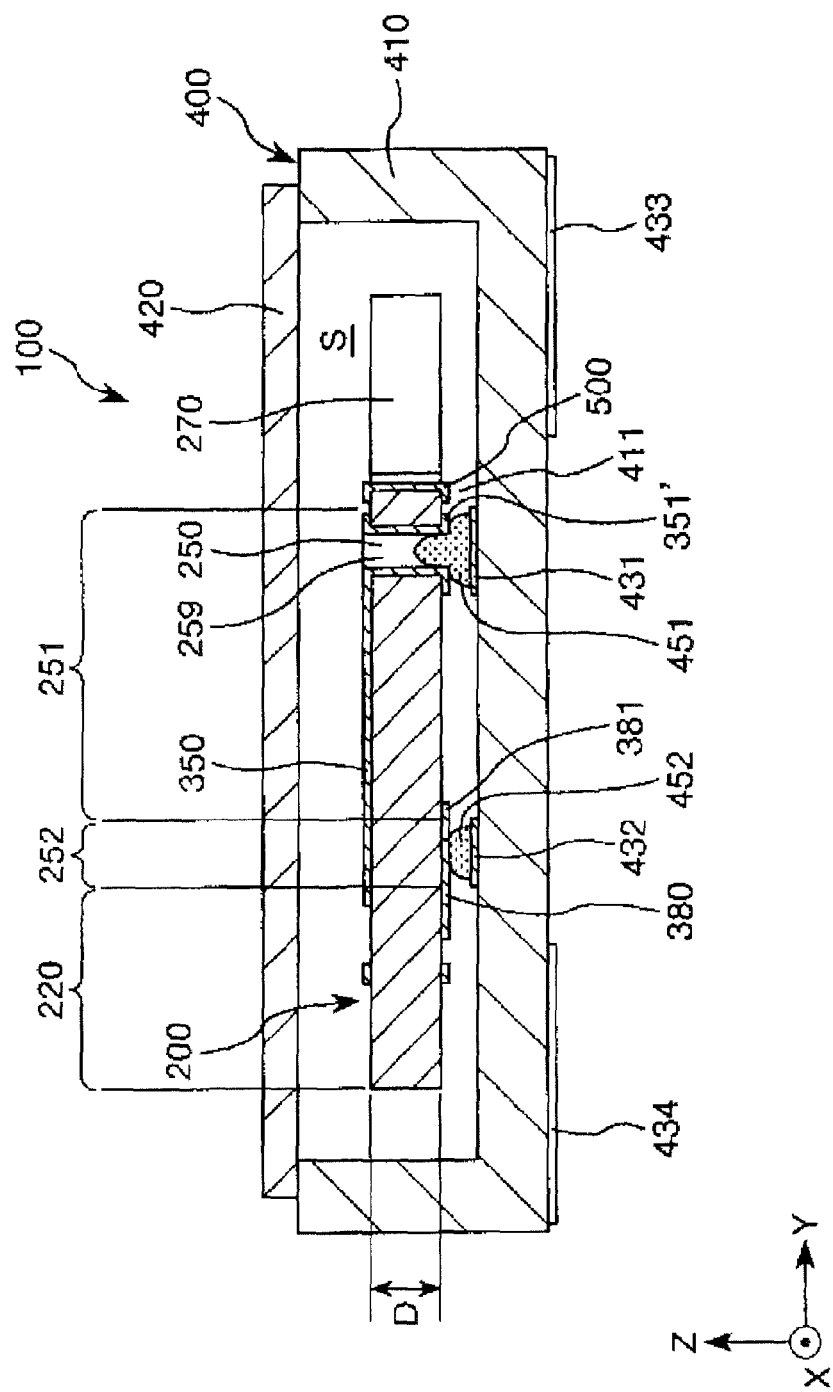
FIG. 15 is a cross-sectional view along the E-E line in FIG. 14A.

FIGS. 14A and 14B are plan views showing a resonator element according to the fourth embodiment of the invention, wherein FIG. 14A is a top view, and FIG. 14B is a bottom view (a transparent view). FIG. 15 is a cross-sectional view along the E-E line in FIG. 14A.

Hereinafter, the resonator according to the fourth embodiment of the invention will be described with reference to these drawings with a focus mainly on the differences from the embodiments described above, and the explanations regarding similar matters will be omitted.

The fourth embodiment is substantially the same as the first embodiment except the point that the configuration of the support arm is different.

The recessed section 254 of the support arm 250 of the resonator element 200C shown in FIGS. 14A and 14B penetrates in the thickness direction (the Z-axis direction) to form a through hole 259. In other words, the recessed section 254 penetrates from a first surface of the support arm 250 to be attached to the base substrate 410 to a second surface of the support arm 250 on the opposite side to the first surface. The through hole 259 also opens in the upper surface, which is a surface on the opposite side to the lower surface including the contact area with which the electrically-conductive adhesive 451 has contact.

Although the length of the through hole 259 in the X-axis direction and the length thereof in the Y-axis direction are not particularly limited, it is preferable that the through hole 259 is longer than the grooves 235, 236, 245, and 246 in the length in the X-axis direction, and further, the length of the through hole 259 in the Y-axis direction is longer than the length of the through hole 259 in the X-axis direction. Since the length of the through hole 259 in the Y-axis direction is longer than the length of the through hole 259 in the X-axis direction, it is possible to prevent the penetration from being hindered by the fins formed on the inner circumferential surface in the Y-axis direction of the through hole 259 when forming the through hole 259 by wet etching. Further, since the through hole 259 is longer than the grooves 235, 236, 245, and 246 in the length in the X-axis direction, the penetration can surely be achieved when forming the outer shape simultaneously from the upper side and the lower side.

As shown in FIG. 15, the wiring line 350 extends on the inner side surface of the through hole 259. The wiring line 350 is also disposed on rim portions of the opening sections on the upper side and the lower side of the through hole 259. The wiring line 350 disposed on the inner side surface of the through hole 259, and the rim portions of the opening sections on the upper side and the lower side constitutes a connection section 351'.

Since such a through hole 259 as described above is disposed, the electrically-conductive adhesive 451 can enter the through hole 259, and thus the contact area between the resonator element 200C and the electrically-conductive adhesive 451 can be enlarged. Thus, the bonding strength between the resonator element 200C and the base substrate 410 is improved. Further, it is possible to surely provide a large contact area between the electrically-conductive adhesive 451 and the connection section 351', and thus, the electrical connection between the electrically-conductive adhesive 451 and the connection section 351' is more surely achieved.

Further, since it can be eliminated to dispose the wiring line 350 on the tip surface of the support arm 250, the process of performing the oblique exposure on the tip surface of the support arm 250 can be eliminated. Thus, the metal film 300' formed on the tip surface of the support arm 250 is formed as the metal film 500 electrically floating.

In general, the process of performing the oblique exposure on the tip surface of the support arm 250 tends to be difficult since the vibrating arms 230, 240 extend in the +Y-axis direction beyond the support arm 250 although depending on the length of the vibrating arms 230, 240, the shape of the hammerheads 260, 270, the distance between these constituents, and so on. However, according to the resonator element 200C of the present embodiment, since such a process as described above can be eliminated, the manufacturing process of the resonator element 200C can be simplified.

Fifth Embodiment

Then, a resonator according to a fifth embodiment of the invention will be explained.

Figure 16A:
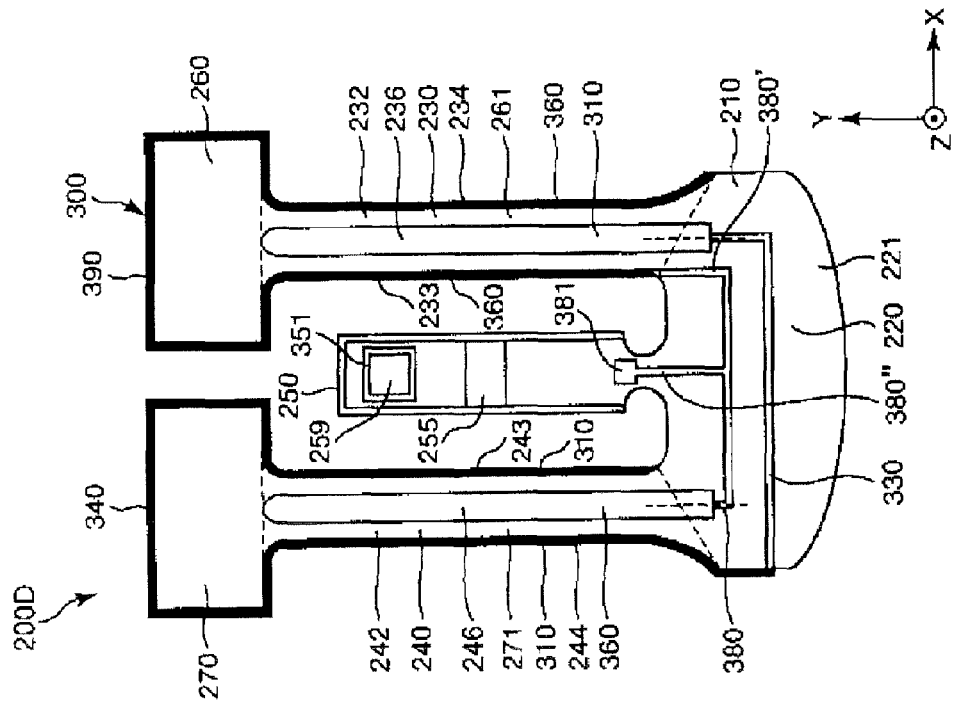
Figure 16B:
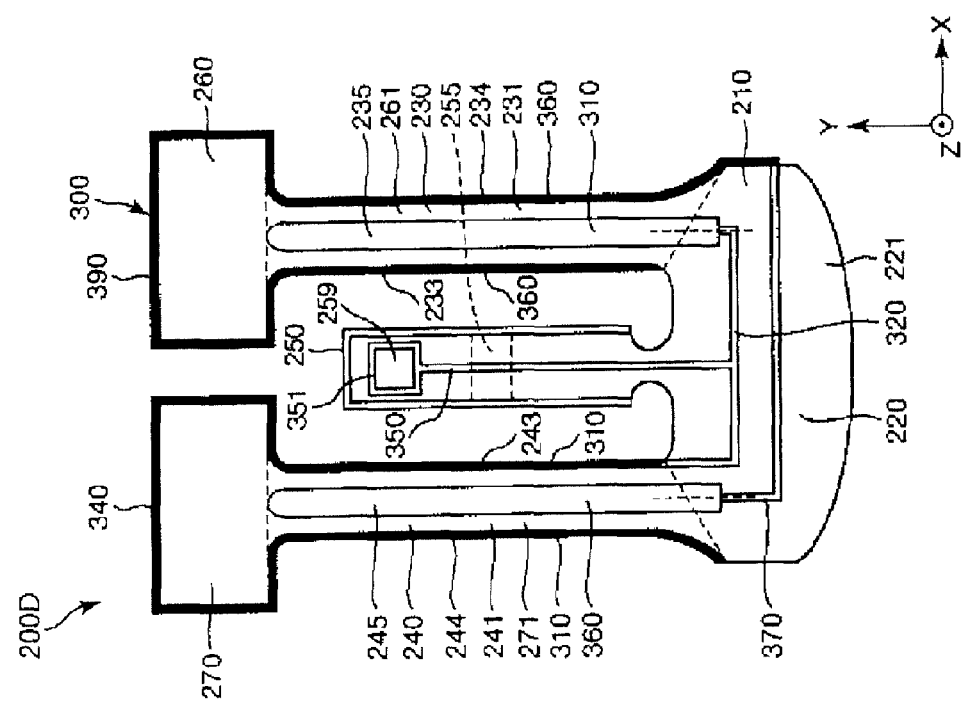

FIGS. 16A and 16B are plan views showing a resonator element according to the fifth embodiment of the invention, wherein FIG. 16A is a top view, and FIG. 16B is a bottom view (a transparent view).

Hereinafter, the resonator according to the fifth embodiment of the invention will be described with reference to these drawings with a focus mainly on the differences from the embodiments described above, and the explanations regarding similar matters will be omitted.

The fifth embodiment is substantially the same as the fourth embodiment except the point that the configuration of the support arm is different.

The resonator element 200D shown in FIGS. 16A and 16E has both of the through hole 259 and the groove 255 described above. Thus, even in the case in which the application quantity of the electrically-conductive adhesive 451 is relatively large in the process of applying the electrically-conductive adhesive 451, the excess of the electrically-conductive adhesive 451 enters the inside of the through hole 259, and can also enter the inside of the groove 255. As described above, in the resonator element 200D, there can be obtained both of the advantage that the resonator element 200D and the base substrate 410 can be bonded to each other at high bonding strength, and the advantage that the short-circuit between the electrically-conductive adhesive 451 and the electrically-conductive adhesive 452 can surely be prevented.

Sixth Embodiment

Then, a resonator according to a sixth embodiment of the invention will be explained.

Figures 17A, 17B:
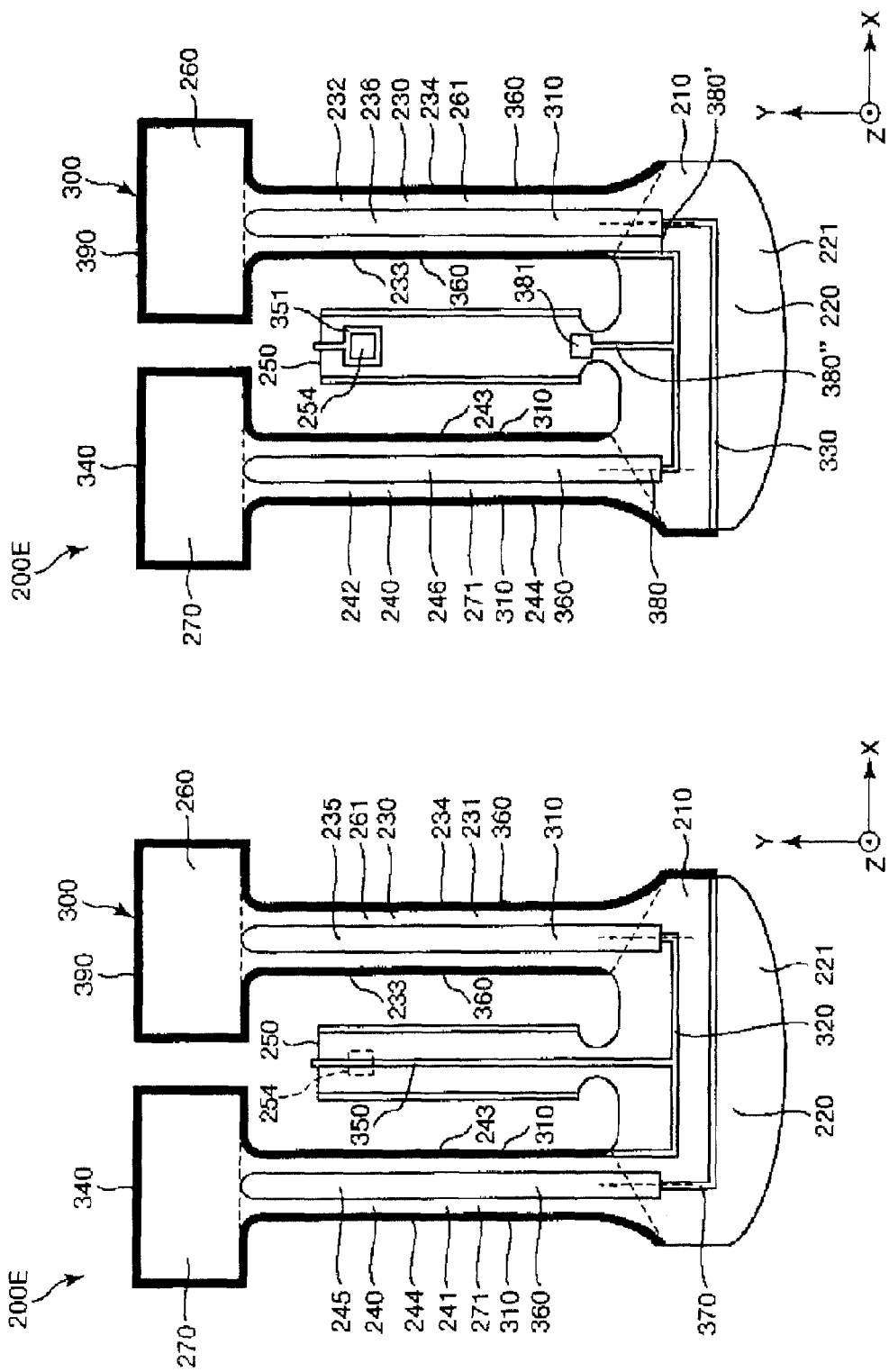

FIGS. 17A and 17B are plan views showing a resonator element according to the sixth embodiment of the invention, wherein FIG. 17A is a top view, and FIG. 17B is a bottom view (a transparent view).

Hereinafter, the resonator according to the sixth embodiment of the invention will be described with reference to these drawings with a focus mainly on the differences from the embodiments described above, and the explanations regarding similar matters will be omitted.

The sixth embodiment is substantially the same as the first embodiment except the point that the configuration of the support arm is different.

In the resonator element 200E shown in FIGS. 17A and 17B, the notches 256 are eliminated. Thus, the resonator element 200E can be obtained with relative ease.

Further, on the side surface of the support arm 250, there is located the metal film 500 electrically floating. Therefore, even in the case in which the electrically-conductive adhesive 451 and the electrically-conductive adhesive 452 creep up along the side surface of the support arm 250, the short-circuit between the electrically-conductive adhesive 451 and the electrically-conductive adhesive 452, and the short-circuit between the first driving electrode 310 and the second driving electrode 360 can be prevented. As a result, it becomes unnecessary to closely regulate the amount of the electrically-conductive adhesive 451 and the electrically-conductive adhesive 452. Therefore, the manufacturing process of the resonator element 200E can be simplified.

It should be noted that although in the embodiments and the modified examples described above, the quartz crystal is used as the constituent material of the resonator element, the constituent material of the resonator element is not limited to the quartz crystal, but there can be used, for example, aluminum nitride (AlN), an oxide substrate made of lithium niobate (LiNbO$_3$), lithium tantalate (LiTaO$_2$), lead zirconium titanate (PZT), lithium tetraborate (Li$_2$B$_4$O$_7$), or langasite (La$_3$Ga$_5$SiO$_{14}$), a multilayer piezoelectric substrate formed by stacking a piezoelectric material such as aluminum nitride or tantalum pentoxide (Ta$_2$O$_5$) on a glass substrate, or piezoelectric ceramics.

Further, the resonator element can be formed using a material other than the piezoelectric material. The resonator element can be formed using, for example, a silicon semiconductor material. Further, the vibration (drive) system of the resonator element is not limited to the piezoelectric drive system. The configuration of the invention and the advantages thereof can be exerted in the resonator element of an electrostatic actuator type using an electrostatic force, or a Lorentz drive type using a magnetic force besides the resonator element of the piezoelectric drive type using the piezoelectric substrate. Further, a term described at least once with a different term having a broader sense or the same meaning in the specification or the accompanying drawings can be replaced with the different term in any part of the specification or the accompanying drawings.

2. Oscillator

Then, the oscillator (the oscillator according to the invention) to which the resonator element according to the invention is applied will be explained.

Figure 18:
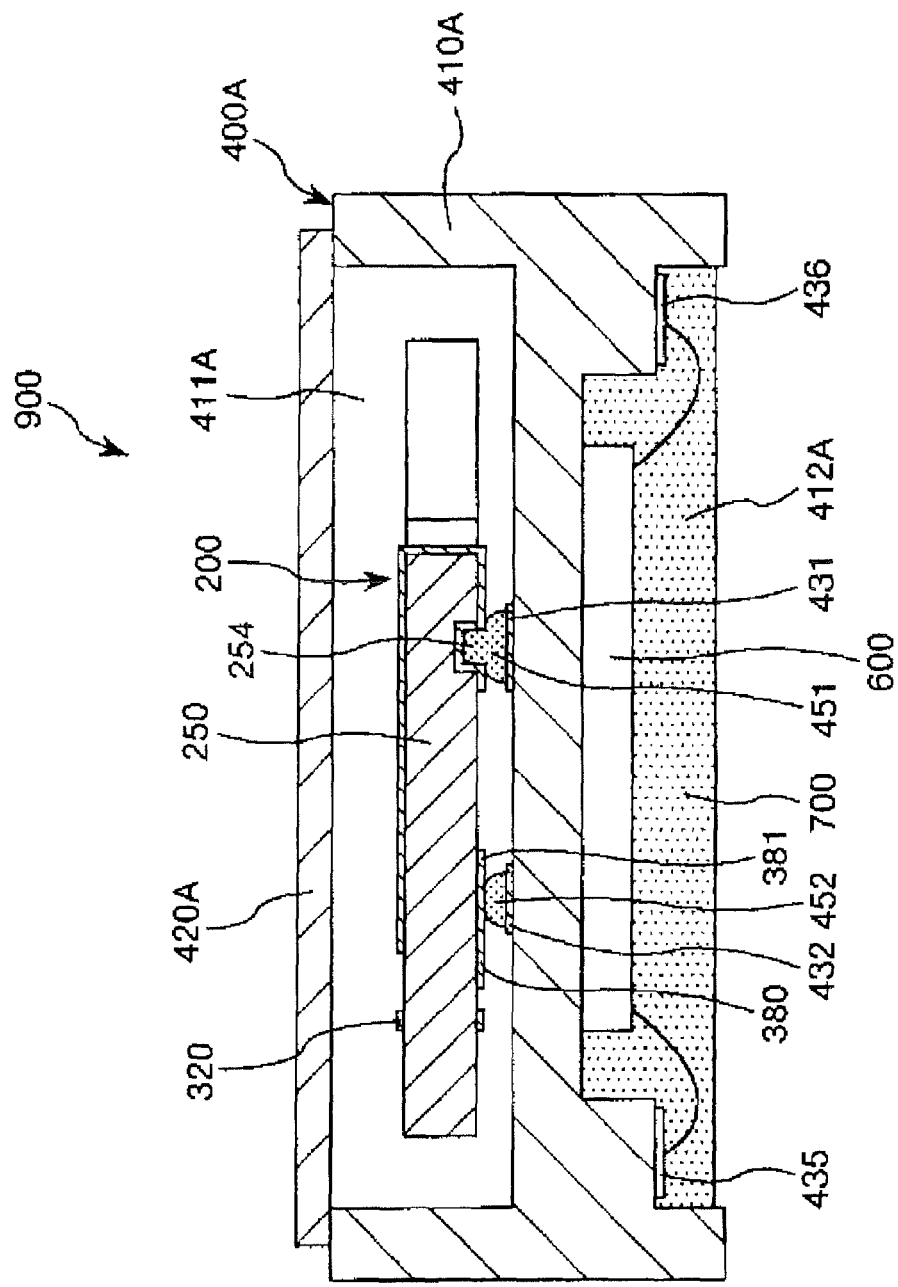
FIG. 18 is a cross-sectional view showing an oscillator equipped with a resonator according to the invention.

The oscillator 900 shown in FIG. 18 has the resonator element 200, a package 400A for housing the resonator element 200, and an IC chip (a chip part) 600 for driving the resonator element 200.

The package 400A has a base substrate 410A and a lid 420A bonded to the base substrate 410A.

The base substrate 410A has a first recessed section 411A opening in the upper surface, and a second recessed section 412A opening in the lower surface.

The opening of the first recessed section 411A is blocked by the lid 420A, and the resonator element 200 is housed in the inside thereof. Further, two connection electrodes 431, 432 are formed inside the first recessed section 411A. The resonator element 200 housed in the first recessed section 411A is supported by and fixed to the base substrate 410A in the support arm 250 via the pair of electrically-conductive adhesives 451, 452. Further, the one electrically-conductive adhesive 451 is disposed so as to electrically connect the connection electrode 431 and the connection section 351 to each other, and the other electrically-conductive adhesive 452 is disposed so as to electrically connect the connection electrode 432 and the connection section 381 to each other.

On the other hand, the IC chip 600 is housed inside the second recessed section 412A, and the IC chip 600 is fixed to the base substrate 410A via an adhesive. Further, at least two IC connection electrodes 435, 436 are formed inside the second recessed section 412A. The IC connection electrode 435 is electrically connected to the IC chip 600 with a bonding wire, and at the same time, electrically connected to the connection electrode 431 via a penetration electrode and inter-layer wiring not shown. Similarly, the IC connection electrode 436 is electrically connected to the IC chip 600 with a bonding wire, and at the same time, electrically connected to the connection electrode 432 via a penetration electrode and inter-layer wiring not shown. Further, the second recessed section 412A is filled with a resin material 700, and the IC chip 600 is encapsulated with the resin material 700.

The IC chip 600 has a driver circuit (an oscillator circuit) for controlling the drive of the resonator element 200, and by driving the resonator element 200 using the IC chip 600, a signal with a predetermined frequency can be taken out.

3. Electronic Apparatus

Then, the electronic apparatus (the electronic apparatus according to the invention) to which the resonator according to the invention is applied will be explained in detail with reference to FIGS. 19 through 21.

Figure 19:
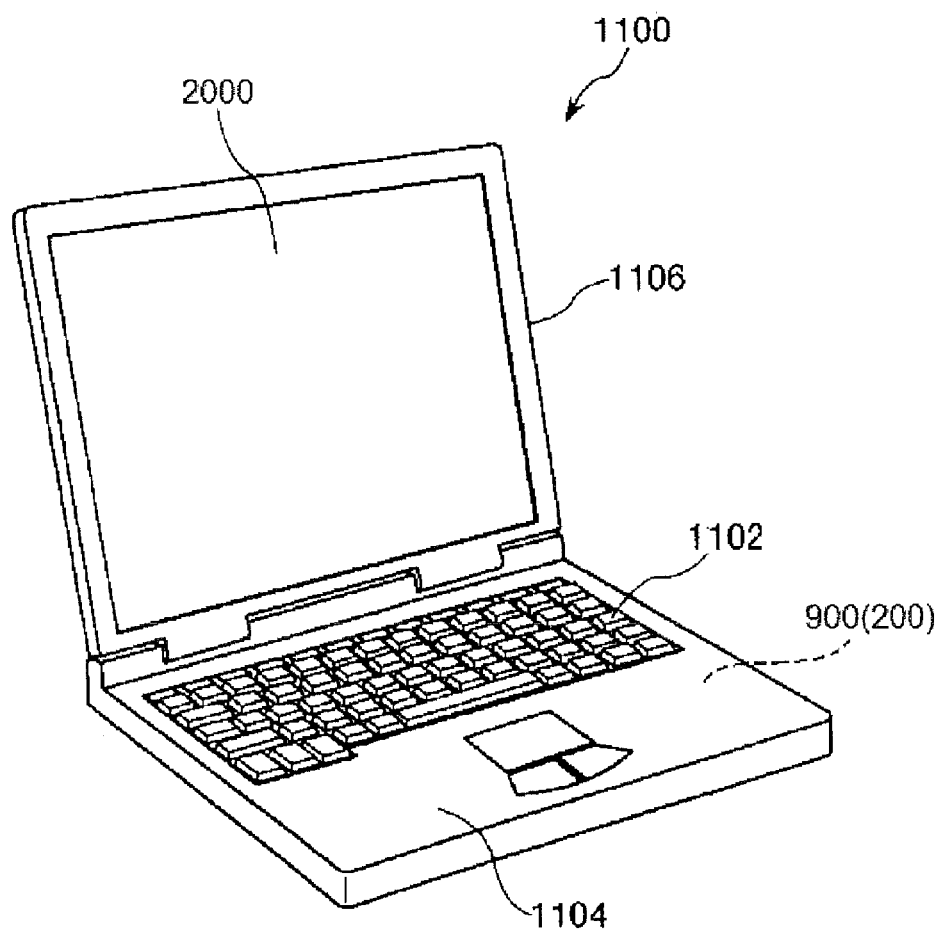
FIG. 19 is a perspective view showing a configuration of a mobile type (or laptop type) personal computer as an example of the electronic apparatus equipped with the resonator according to the invention.

FIG. 19 is a perspective view showing a configuration of a mobile type (or laptop type) personal computer as an example of the electronic apparatus equipped with the resonator element according to the invention. In the drawing, the personal computer 1100 includes a main body section 1104 provided with a keyboard 1102, and a display unit 1106 provided with a display section 2000, and the display unit 1106 is pivotally supported with respect to the main body section 1104 via a hinge structure. Such a personal computer 1100 incorporates the oscillator 900 (the resonator 100).

Figure 20:
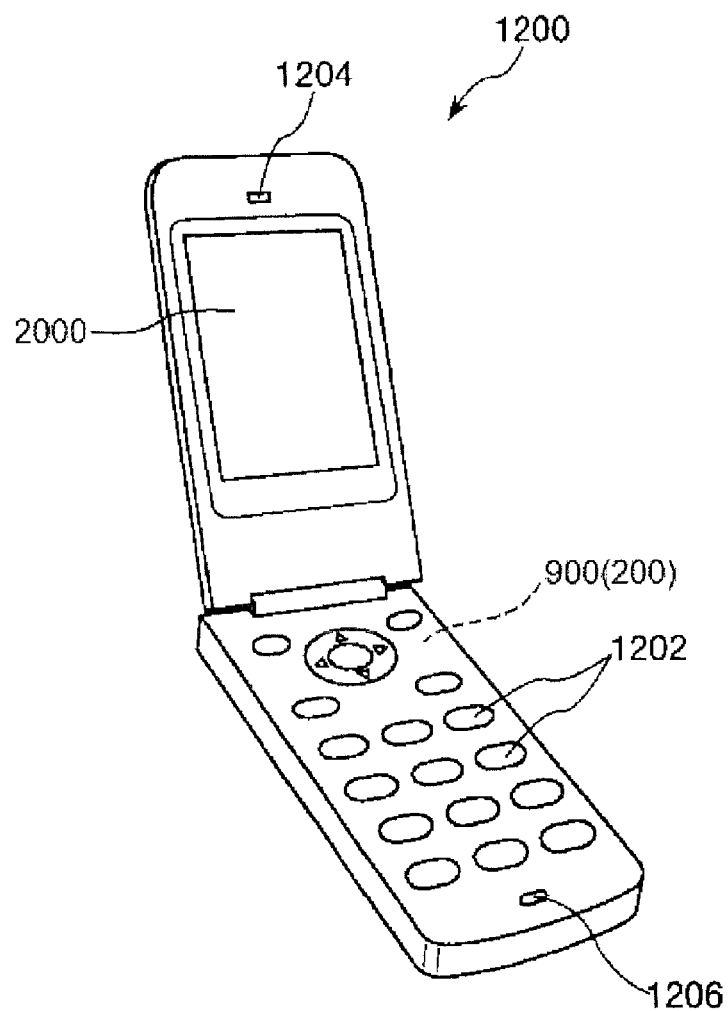
FIG. 20 is a perspective view showing a configuration of a cellular phone (including PHS) as an example of an electronic apparatus equipped with the resonator according to the invention.

FIG. 20 is a perspective view showing a configuration of a cellular phone (including PHS) as an example of the electronic apparatus equipped with the resonator according to the invention. In this drawing, the cellular phone 1200 is provided with a plurality of operation buttons 1202, an ear piece 1204, and a mouthpiece 1206, and the a display section 2000 is disposed between the operation buttons 1202 and the ear piece 1204. Such a cellular phone 1200 incorporates the oscillator 900 (the resonator 100).

Figure 21:
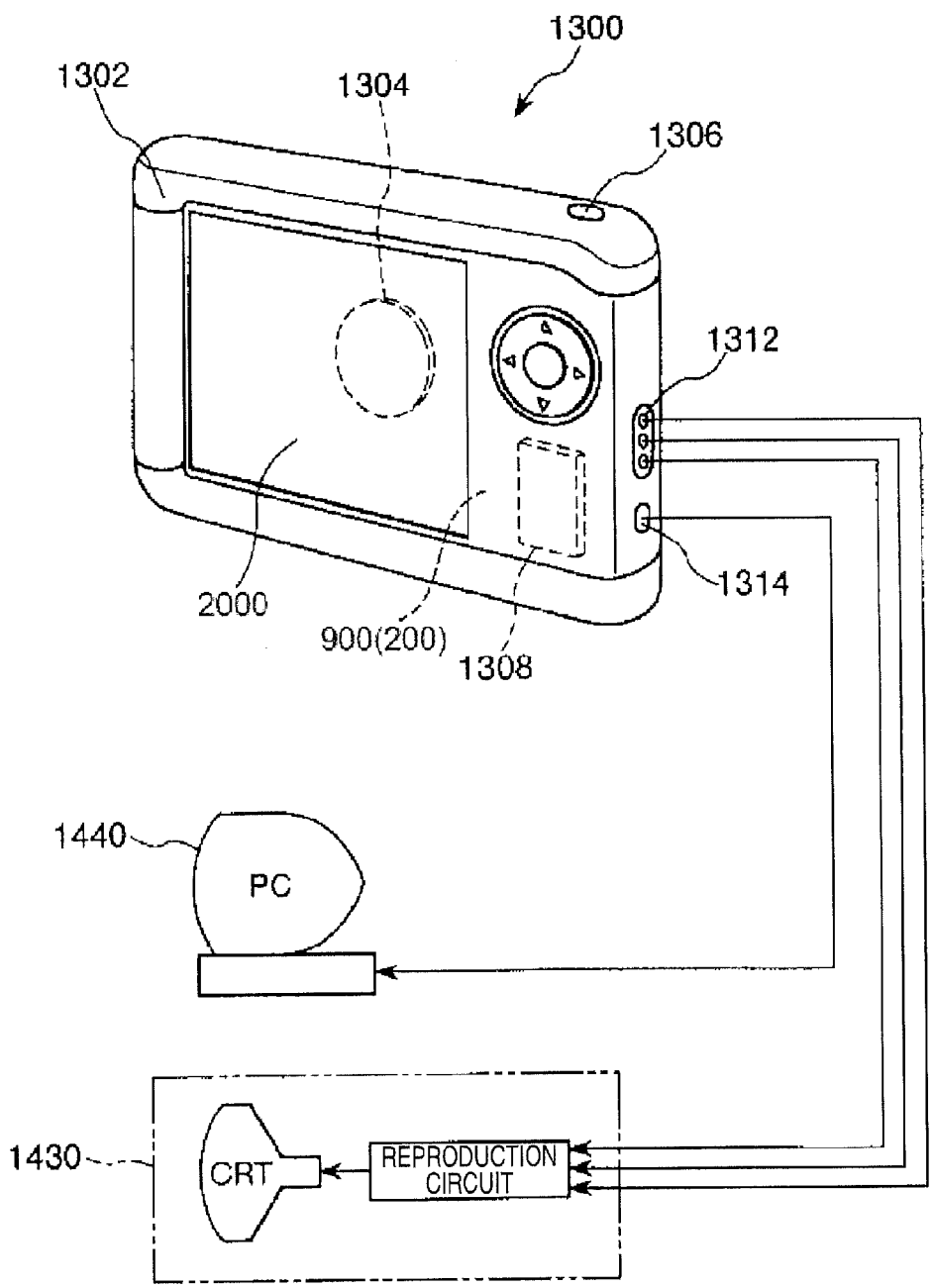
FIG. 21 is a perspective view showing a configuration of a digital still camera as an example of the electronic apparatus equipped with the resonator according to the invention.

FIG. 21 is a perspective view showing a configuration of a digital still camera as an example of the electronic apparatus equipped with the resonator according to the invention. It should be noted that the connection with external equipment is also shown briefly in this drawing. Here, conventional cameras expose a silver salt film to an optical image of an object, while the digital still camera 1300 performs photoelectric conversion on an optical image of an object by an imaging element such as a CCD (a charge coupled device) to generate an imaging signal (an image signal).

The case (body) 1302 of the digital still camera 1300 is provided with a display section on the back surface thereof to form a configuration of displaying an image in accordance with the imaging signal from the CCD, wherein the display section functions as a viewfinder for displaying an electronic image of the object. Further, the front surface (the back side in the drawing) of the case 1302 is provided with a light receiving unit 1304 including an optical lens (an imaging optical system), the CCD, and so on.

When the photographer confirms an object image displayed on the display section, and then pushes a shutter button 1306 down, the imaging signal from the CCD at that moment is transferred to and stored in the memory device 1308. Further, the digital still camera 1300 is provided with video signal output terminals 1312 and an input-output terminal 1314 for data communication disposed on a side surface of the case 1302. Further, as shown in the drawing, a television monitor 1430 and a personal computer 1440 are respectively connected to the video signal output terminals 1312 and the input-output terminal 1314 for data communication according to needs. Further, there is adopted the configuration in which the imaging signal stored in the memory device 1308 is output to the television monitor 1430 and the personal computer 1440 in accordance with a predetermined operation. Such a digital still camera 1300 incorporates the oscillator 900 (the resonator 100).

4. Moving Object

Then, the moving object (the moving object according to the invention) to which the resonator according to the invention is applied will be explained in detail with reference to FIG. 22.

Figure 22:
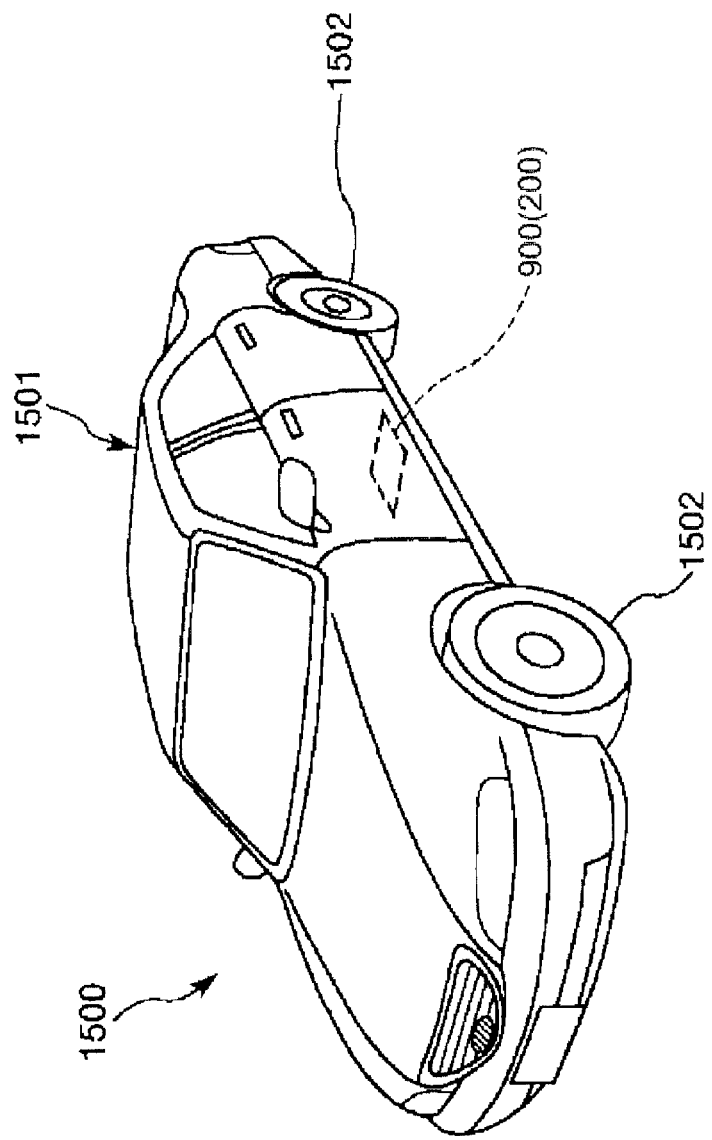
FIG. 22 is a perspective view showing a configuration of a moving object (a vehicle) to which the electronic apparatus equipped with the resonator according to the invention is applied.

FIG. 22 is a perspective view showing a configuration of a moving object (a vehicle) as an example of the electronic apparatus equipped with the resonator according to the invention. In the drawing, the moving object 1500 has a vehicle body 1501, and four wheels 1502, and is configured to rotate the wheels 1502 by a power source (an engine) not shown provided to the vehicle body 1501. Such a moving object 1500 incorporates the oscillator 900 (the resonator 100).

It should be noted that, as the electronic apparatus equipped with the resonator according to the invention, there can be cited, for example, an inkjet ejection device (e.g., an inkjet printer), a laptop personal computer, a television set, a video camera, a video cassette recorder, a car navigation system, a pager, a personal digital assistance (including one with a communication function), an electronic dictionary, an electric calculator, a computerized game machine, a word processor, a workstation, a video phone, a security video monitor, a pair of electronic binoculars, a POS terminal, a medical device (e.g., an electronic thermometer, an electronic manometer, an electronic blood sugar meter, an electrocardiogram measurement instrument, an ultrasonograph, and an electronic endoscope), a fish detector, various types of measurement instruments, various types of gauges (e.g., gauges for a vehicle, an aircraft, or a ship), and a flight simulator besides the personal computer (the mobile personal computer) shown in FIG. 19, the cellular phone shown in FIG. 20, the digital still camera shown in FIG. 21, and the moving object shown in FIG. 22.

Although hereinabove, the resonator, the oscillator, the electronic apparatus, and the moving object according to the invention are explained along the embodiments shown in the drawings, the invention is not limited to the embodiments, and each of the constituents of the resonator, the oscillator, the electronic apparatus, and the moving object can be replaced with what can exert substantially the same function and has an arbitrary configuration. Further, it is also possible to add any constituents.

Further, the resonator, the oscillator, the electronic apparatus, and the moving object according to the invention can be a combination of any two or more configurations (features) out of the embodiments described above.

The entire disclosure of Japanese Patent Application No. 2013-075328, filed Mar. 29, 2013 is expressly incorporated by reference herein.

What is claimed is:

1. A resonator element comprising:
   a base section; and
   a resonator element including
      a pair of vibrating arms extending in a first direction from the base section, arranged in a second direction perpendicular to the first direction, and flexurally vibrating while alternately repeating getting closer to and getting away from each other along the second direction in a planar view, and
      a support arm disposed between the pair of vibrating arms, and extending along the first direction from the base section in the planar view,
   wherein the support arm includes
      a first portion, and
      a second portion disposed on the base section side of the first portion in the planar view, smaller in length along the second direction than the first portion, and attached to a base with a fixation material,
   the second portion is in a shape such that an outer shape of a cross section in a thickness direction along a third direction perpendicular to the first and second directions includes
      first and second sides that are parallel to each other and establish a thickness;
      a first outer shape portion that is within the thickness range, is connected to one end portion of the first side and one end portion of the second side, and is bent so as to project in a direction of separation from the first and second sides; and
      a second outer shape portion that is within the thickness range, is connected to the other end portion of the first side and the other end portion of the second side, and is bent so as to project in the direction of separation from the first and second sides.

2. The resonator element according to claim 1, wherein a Young's modulus of the fixation material is smaller than a Young's modulus of the resonator element.

3. The resonator element according to claim 2, wherein the Young's modulus of the fixation material is in a range of no lower than 50 MPa and no higher than 6000 MPa.

4. The resonator element according to claim 1, wherein a length of the second portion along the second direction is no lower than 20 % and no higher than 50 % of a length of the first portion along the second direction.

5. The resonator element according to claim 1, wherein a side surface of the second portion along a third direction perpendicular to the first direction and the second direction includes an area to be bonded to the fixation material.

6. The resonator element according to claim 1, wherein the first portion is provided with a recessed section disposed in an area to be attached to the base with the fixation material.

7. The resonator element according to claim 6, wherein the recessed section penetrates from a first surface of the support arm to be attached to the base to a second surface of the support arm on an opposite side to the first surface.

8. The resonator element according to claim 6, wherein the recessed section is provided in a tip area of the first portion of the support arm.

9. The resonator element according to claim 1, wherein the support arm is provided with a groove disposed along the second direction on the first portion side of the second portion in the planar view.

10. The resonator element according to claim 1, wherein the vibrating arms each include
    a weight section, and
    an arm section disposed between the weight section and the base section in the planar view.

11. The resonator element according to claim 10, wherein the weight section includes a widened portion larger in width along the second direction than the arm section.

12. A resonator comprising:
    the resonator element according to claim 1; and
    the base on which the resonator element is mounted.

13. An oscillator comprising:
    the resonator element according to claim 1; and
    an oscillator circuit.

14. An electronic apparatus comprising:
    resonator element according to claim 1.

15. A moving object comprising:
    resonator element according to claim 1.

* * * * *